(12) United States Patent
Shimizu et al.

(10) Patent No.: US 12,327,787 B2
(45) Date of Patent: Jun. 10, 2025

(54) SEMICONDUCTOR MEMORY DEVICE

(71) Applicant: Kioxia Corporation, Tokyo (JP)

(72) Inventors: Takashi Shimizu, Nagoya (JP);
Takashi Fukushima, Yokkaichi (JP);
Naomi Fukumaki, Yokkaichi (JP);
Hiroko Tahara, Yokkaichi (JP);
Kenichi Ide, Kuwana (JP)

(73) Assignee: Kioxia Corporation, Tokyo (JP)

( * ) Notice: Subject to any disclaimer, the term of this patent is extended or adjusted under 35 U.S.C. 154(b) by 510 days.

(21) Appl. No.: 17/447,332

(22) Filed: Sep. 10, 2021

(65) Prior Publication Data
US 2021/0407905 A1    Dec. 30, 2021

Related U.S. Application Data

(63) Continuation of application No. PCT/JP2020/024598, filed on Jun. 23, 2020.

(51) Int. Cl.
*H01L 23/522*    (2006.01)
*H01L 21/768*    (2006.01)
(Continued)

(52) U.S. Cl.
CPC .... *H01L 23/5226* (2013.01); *H01L 21/76802* (2013.01); *H01L 21/76843* (2013.01);
(Continued)

(58) Field of Classification Search
CPC ........... H01L 23/5226; H01L 21/76802; H01L 21/76843; H01L 21/76877;
(Continued)

(56) References Cited

U.S. PATENT DOCUMENTS 6,576,527 B2    6/2003    Nakamura
7,821,058 B2    10/2010   Kidoh et al.
(Continued)

FOREIGN PATENT DOCUMENTS

| JP | 2015-056452 A | 3/2015 |
| JP | 2015-142133 A | 8/2015 |
| JP | 2018-046167 A | 3/2018 |
| JP | 2020-027873 A | 2/2020 |
| JP | 2020-047806 A | 3/2020 |

OTHER PUBLICATIONS

International Search Report issued Sep. 8, 2020 in PCT/JP2020/024598 filed on Jun. 23, 2020, 3 pages (with English Translation of Categories of Cited Documents).

*Primary Examiner* — Monica D Harrison
*Assistant Examiner* — Andre C Stevenson
(74) *Attorney, Agent, or Firm* — Oblon, McClelland, Maier & Neustadt, L.L.P.

(57) ABSTRACT

According to one embodiment, a semiconductor memory device includes: a plurality of first conductive layers that each include tungsten; a plurality of insulating films that include a stacked portion and a first projecting portion projecting; a semiconductor layer extending through an inside of a stacked body; a charge storage layer arranged between the plurality of first conductive layers and the semiconductor layer; a plurality of second conductive layers that are each arranged on the first projecting portion in such a manner as to be in contact with a single first conductive layer and that include silicon containing an impurity; and a plurality of contact plugs that are each provided on a single second conductive layer in such a manner as to be in contact with the single second conductive layer.

8 Claims, 23 Drawing Sheets

(51) Int. Cl.
*H01L 23/532* (2006.01)
*H10B 41/27* (2023.01)
*H10B 43/27* (2023.01)

(52) U.S. Cl.
CPC .. *H01L 21/76877* (2013.01); *H01L 23/53266* (2013.01); *H01L 23/53271* (2013.01); *H10B 41/27* (2023.02); *H10B 43/27* (2023.02)

(58) Field of Classification Search
CPC ........ H01L 23/53266; H01L 23/53271; H10B 41/27; H10B 43/27
See application file for complete search history.

(56) References Cited

U.S. PATENT DOCUMENTS

| | | |
|---|---|---|
| 8,581,330 B2 | 11/2013 | Kiyotoshi |
| 10,770,471 B2 | 9/2020 | Shimizu et al. |
| 10,784,280 B2 | 9/2020 | Ohtori et al. |
| 2010/0013049 A1 | 1/2010 | Tanaka et al. |
| 2015/0069499 A1 | 3/2015 | Nakaki |
| 2015/0214242 A1 | 7/2015 | Lee |
| 2019/0148398 A1 | 5/2019 | Kim et al. |
| 2020/0051989 A1 | 2/2020 | Shimizu et al. |
| 2020/0286876 A1* | 9/2020 | Nakaki ................... H01L 25/18 |
| 2020/0312765 A1* | 10/2020 | Kawasaki .............. H10B 41/35 |

\* cited by examiner

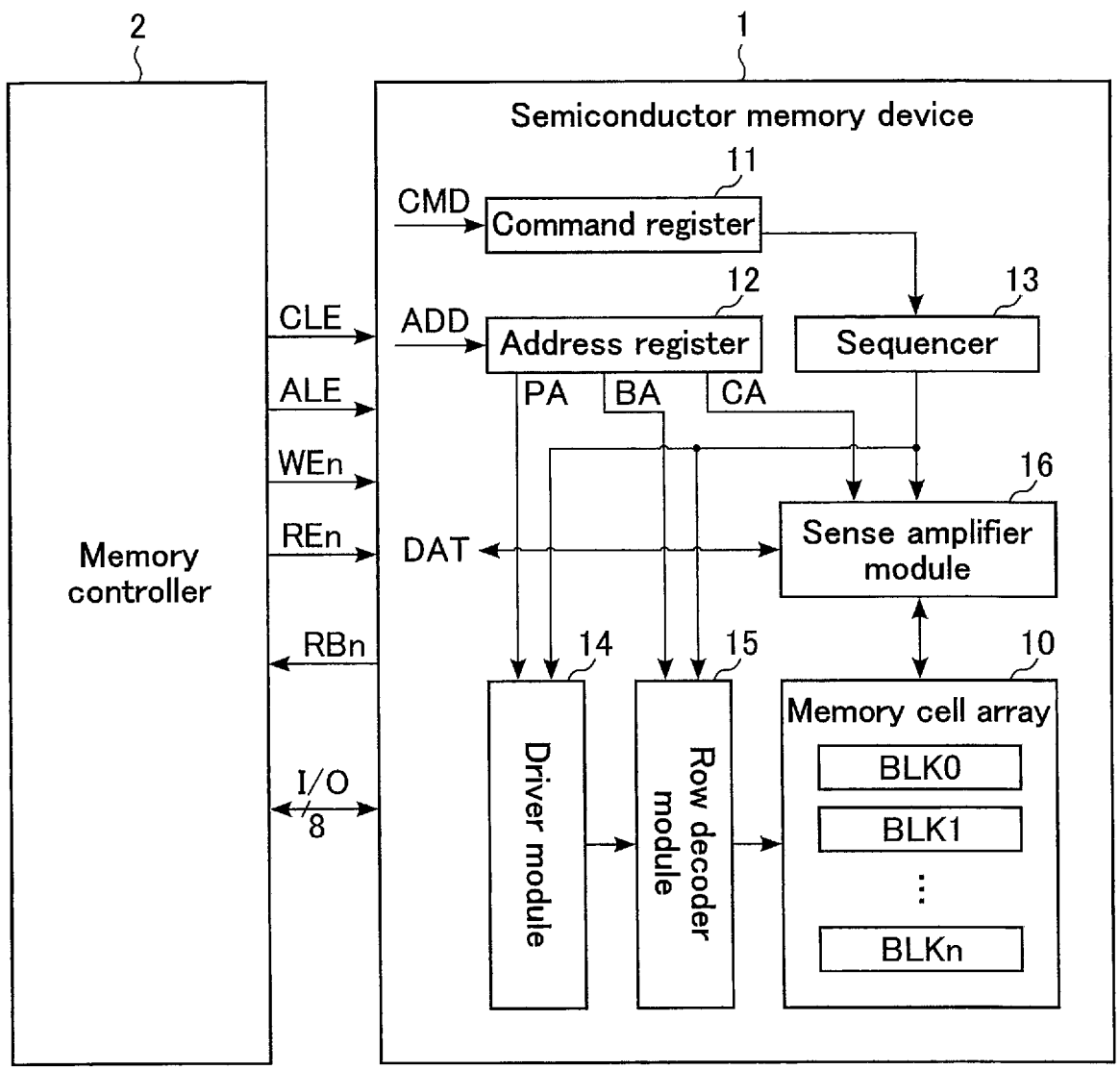
F I G. 1

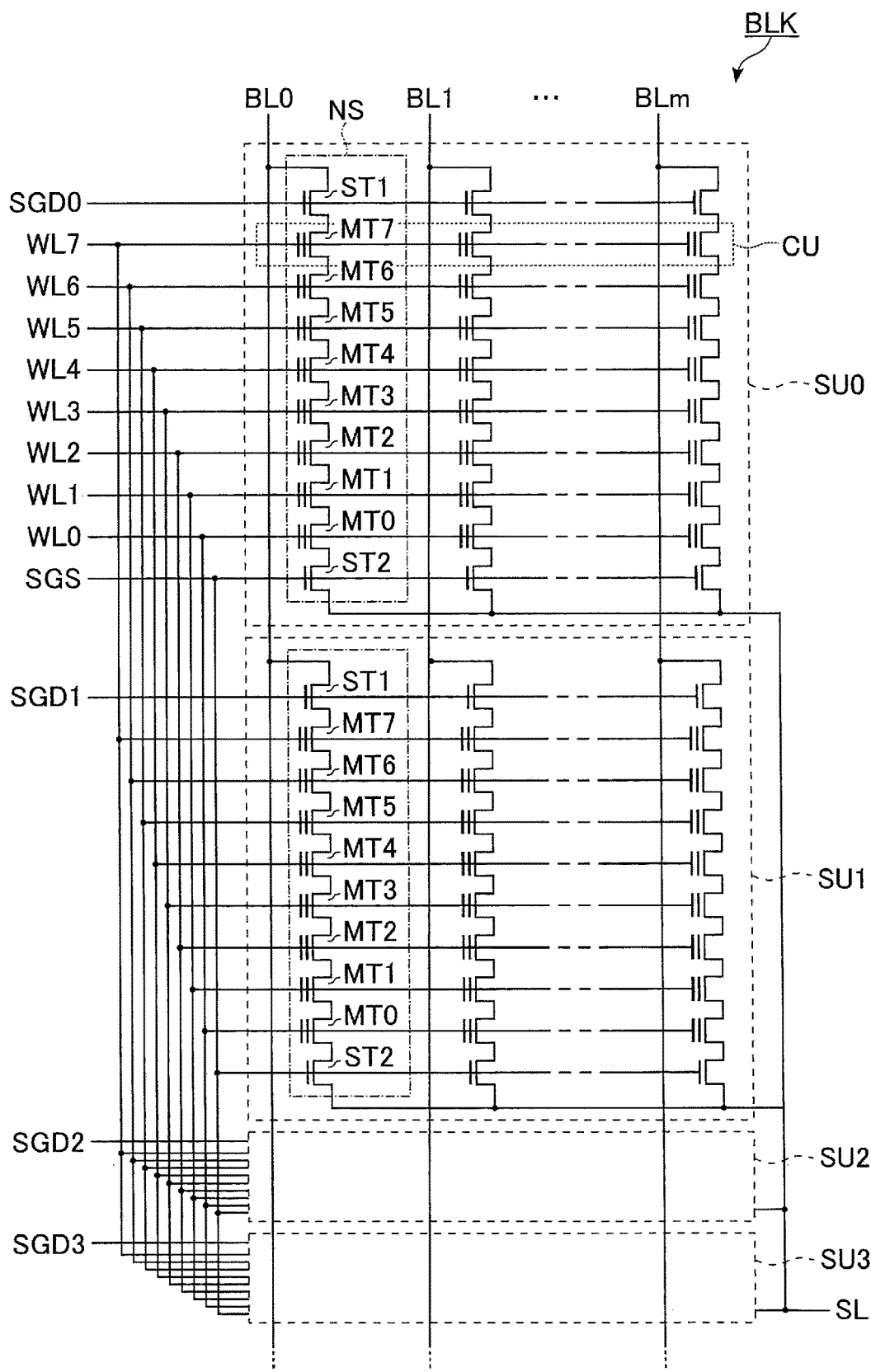
F I G. 2

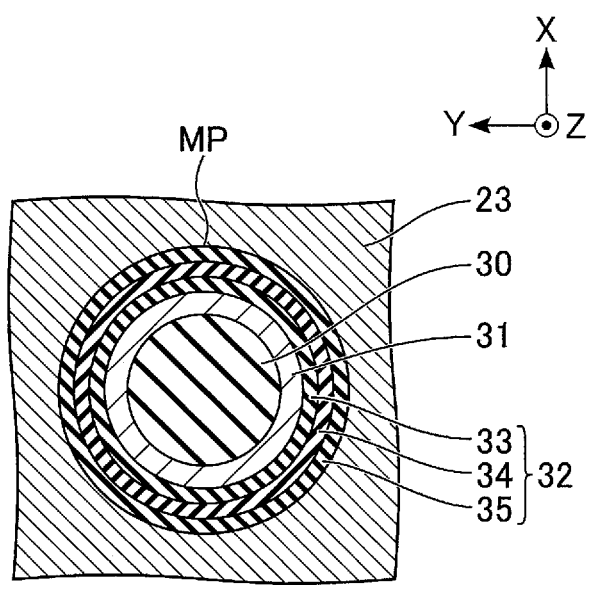
F I G. 6

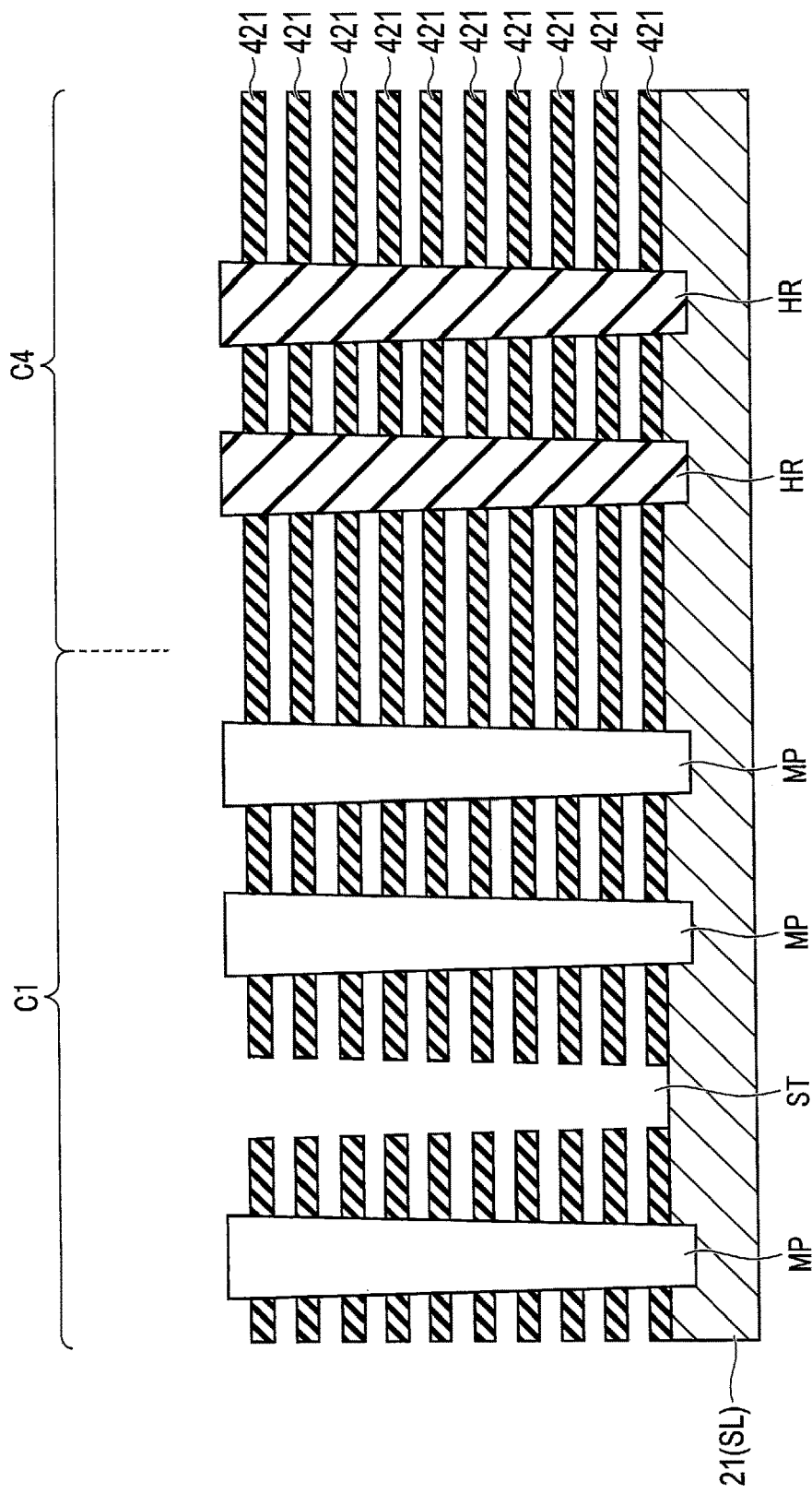
F I G. 21

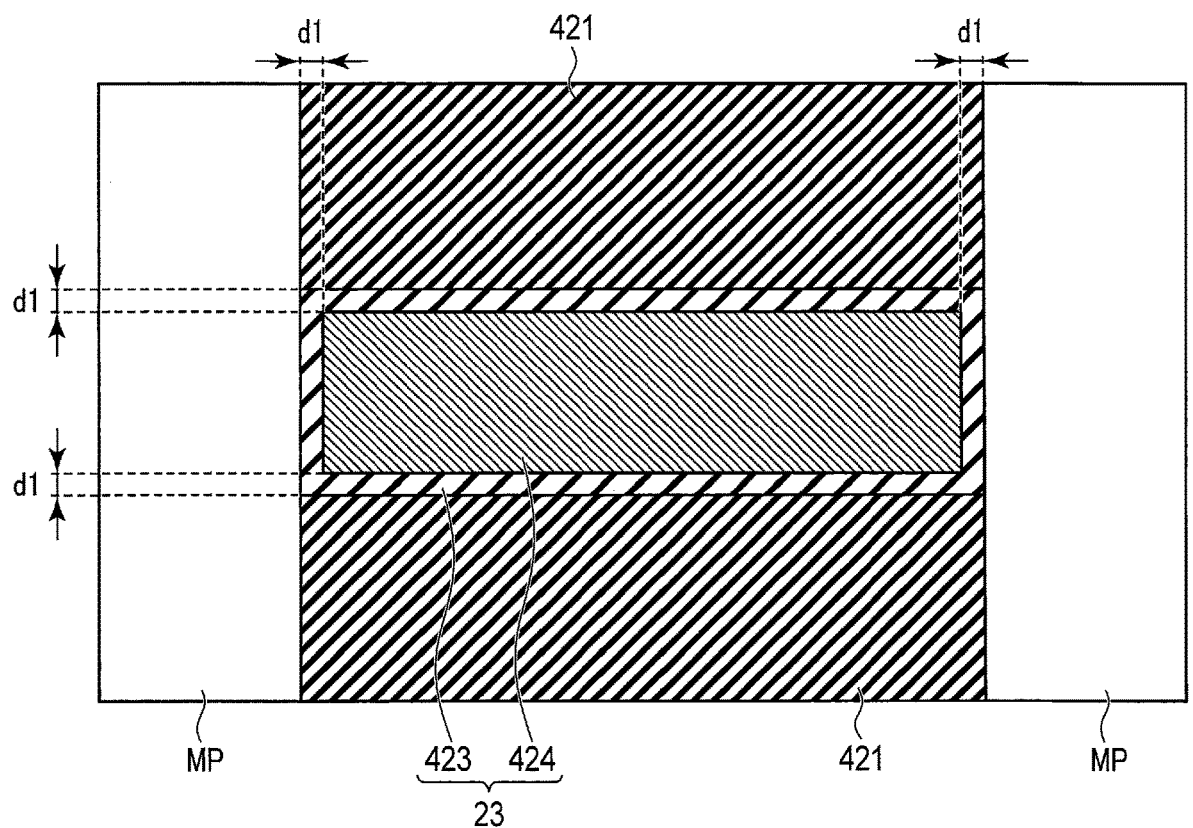
F I G. 23

SEMICONDUCTOR MEMORY DEVICE

CROSS-REFERENCE TO RELATED APPLICATIONS

This application is a Continuation Application of PCT Application No. PCT/JP2020/024598, filed Jun. 23, 2020, and based upon, Japanese Patent Application No. 2019-060253, filed Mar. 27, 2019, the entire contents of all of which are incorporated herein by reference.

FIELD

Embodiments described herein relate generally to a semiconductor memory device.

BACKGROUND

A NAND flash memory capable of nonvolatilely storing data is known.

BRIEF DESCRIPTION OF THE DRAWINGS

FIG. 1 is a block diagram showing an exemplary configuration of a semiconductor memory device 1 according to an embodiment.

FIG. 2 is a circuit diagram showing a configuration of a memory cell array 10 included in the semiconductor memory device 1 according to the embodiment.

FIG. 6 is a cross-sectional view showing a configuration of a memory pillar MP in the semiconductor memory device 1 according to the embodiment.

FIG. 21 is a cross-sectional view of the memory cell array 10 for illustrating a step of manufacturing the semiconductor memory device 1 according to the comparative example.

FIG. 23 is a cross-sectional view showing a configuration of the memory cell array 10 shown as D in FIG. 22.

DETAILED DESCRIPTION

Figure 3:
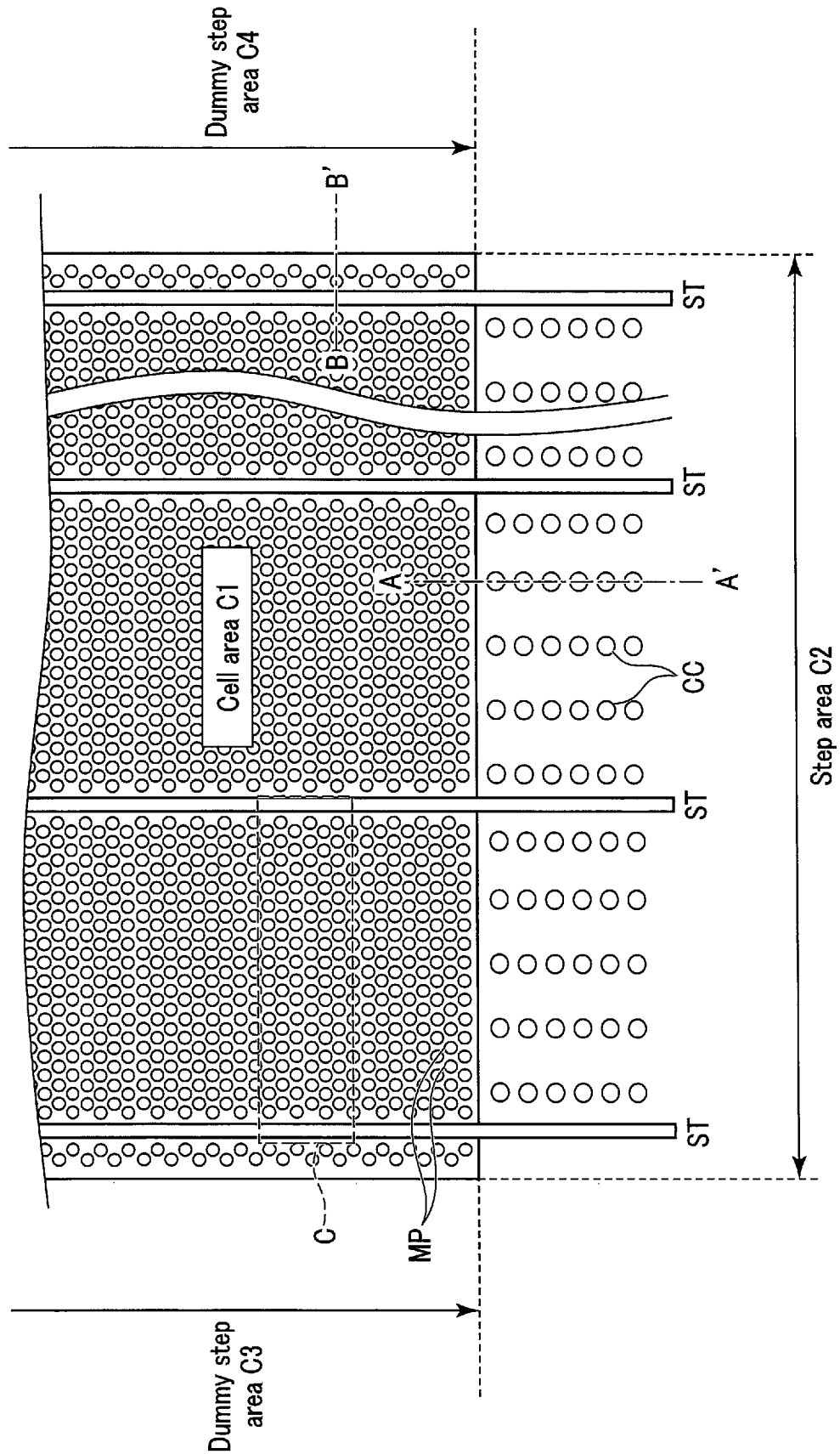
FIG. 3 is a plan view showing a layout of the memory cell array 10 included in the semiconductor memory device 1 according to the embodiment.

In general, according to one embodiment, a semiconductor memory device includes: a plurality of first conductive layers that are stacked in a first direction and each include tungsten; a plurality of insulating films that each include a stacked portion stacked with the first conductive layers in an alternating manner, and a first projecting portion projecting in a second direction orthogonal to the first direction; a semiconductor layer extending in the first direction through an inside of a stacked body that includes the plurality of stacked portions and the plurality of first conductive layers; a charge storage layer arranged between the plurality of first conductive layers and the semiconductor layer; a plurality of second conductive layers that are each arranged on the first projecting portion of a single insulating film of the plurality of insulating films in such a manner as to be in contact with a single first conductive layer of the plurality of first conductive layers and that include silicon containing an impurity; and a plurality of contact plugs that are each provided on a single second conductive layer of the plurality of second conductive layers in such a manner as to be in contact with the single second conductive layer, that have conductivity, and that extend in the first direction.

Hereinafter, embodiments will be described with reference to the accompanying drawings. Each of the embodiments is an example of an apparatus or a method to embody a technical idea of the invention. The drawings are schematic or conceptual, and the dimensions and ratios, etc. in the drawings are not always the same as the actual ones. The technical idea of the present invention is not specified by the shapes, structures, arrangements, etc. of the components.

<1> Embodiment

FIG. 1 shows an example of a semiconductor memory device 1 according to an embodiment. Hereinafter, the semiconductor memory device 1 according to the embodiment will be described.

<1-1> Configuration of Semiconductor Memory Device 1

<1-1-1> Overall Configuration of Semiconductor Memory Device 1

The semiconductor memory device 1 is, for example, a NAND flash memory capable of storing data nonvolatilely. The semiconductor memory device 1 is controlled by, for example, an external memory controller 2.

As shown in FIG. 1, the semiconductor memory device 1 includes a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer not less than 1). The block BLK is a set of a plurality of memory cells capable of storing data nonvolatilely, and is used as, for example, a unit of data erasure.

A plurality of bit lines and word lines are provided in the memory cell array 10. Each memory cell is, for example, associated with one bit line and one word line. A detailed configuration of the memory cell array 10 will be described later.

The command register 11 stores a command CMD received by the semiconductor memory device 1 from the memory controller 2. The command CMD includes an instruction to instruct, for example, the sequencer 13 to perform a read operation, a write operation, an erase operation, etc.

The address register 12 stores address information ADD received by the semiconductor memory device 1 from the memory controller 2. The address information ADD includes, for example, a block address BA, a page address PA, and a column address CA. For example, the block address BA, the page address PA, and the column address CA are used to select a block BLK, a word line, and a bit line, respectively.

The sequencer 13 controls the overall operation of the semiconductor memory device 1. For example, the sequencer 13 controls the driver module 14, the row decoder module 15, and the sense amplifier module 16, etc., based on the command CMD stored in the command register 11, thereby performing a read operation, a write operation, an erase operation, etc.

The driver module 14 generates voltages used in a read operation, a write operation, an erase operation, etc. Then, the driver module 14 applies a generated voltage to a signal line corresponding to a selected word line based on, for example, the page address PA stored in the address register 12.

Based on the block address BA stored in the address register 12, the row decoder module 15 selects one corresponding block BLK in the memory cell array 10. Then, the row decoder module 15 transfers, for example, the voltage applied to the signal line corresponding to the selected word line to the selected word line in the selected block BLK.

In a write operation, the sense amplifier module 16 applies a desired voltage to each bit line in accordance with write data DAT received from the memory controller 2. In a read operation, the sense amplifier module 16 judges data stored in a memory cell based on the voltage of the corresponding bit line, and transfers the judgment result to the memory controller 2 as read data DAT.

Communication between the semiconductor memory device 1 and the memory controller 2 supports, for example, a NAND interface standard. For example, communication between the semiconductor memory device 1 and the memory controller 2 uses a command latch enable signal CLE, an address latch enable signal ALE, a write enable signal WEn, a read enable signal REn, a ready/busy signal RBn, and an input/output signal I/O.

The command latch enable signal CLE is a signal indicating that the input/output signal I/O received by the semiconductor memory device 1 is a command CMD. The address latch enable signal ALE is a signal indicating that the input/output signal I/O received by the semiconductor memory device 1 is address information ADD. The write enable signal WEn is a signal instructing the semiconductor memory device 1 to input an input/output signal I/O therein. The read enable signal REn is a signal instructing the semiconductor memory device 1 to output an input/output signal I/O therefrom.

The ready/busy signal RBn is a signal that notifies the memory controller 2 of whether the semiconductor memory device 1 is in a ready state in which the semiconductor memory device 1 accepts an instruction from the memory controller 2 or in a busy state in which the semiconductor memory device 1 does not accept the instruction. The input/output signal I/O is, for example, an 8-bit signal, and may include a command CMD, address information ADD, and data DAT.

The semiconductor memory device 1 and the memory controller 2 described in the above may constitute a single semiconductor memory device in combination. Examples of such a semiconductor device include a memory card, such as an SD™ card, and a solid state drive (SSD).

<1-1-2> Circuit Configuration of Memory Cell Array 10

FIG. 2 illustrates a circuit configuration of the memory cell array 10 included in the semiconductor memory device 1 according to the embodiment by extracting one of the blocks BLK included in the memory cell array 10.

As shown in FIG. 2, a block BLK includes, for example, four string units SU0 to SU3. Each of the string units SU includes a plurality of NAND strings NS.

The NAND strings NS are associated with respective bit lines BL0 to BLm (m is an integer not less than 1). Each NAND string NS includes, for example, memory cell transistors MT0 to MT7 and select transistors ST1 and ST2.

Each memory cell transistor MT includes a control gate and a charge storage layer, and stores data nonvolatilely. Each of the select transistors ST1 and ST2 is used for selection of a string unit SU in various operations.

The drain of select transistor ST1 of each NAND string NS is coupled to an associated bit line BL. The source of select transistor ST1 is coupled to one end of a set of memory cell transistors MT0 to MT7 coupled in series. The other end of the set of memory cell transistors MT0 to MT7 coupled in series is coupled to the drain of select transistor ST2.

The sources of select transistors ST2 in the same block BLK are coupled in common to a source line SL. The gates of select transistors ST1 in the string units SU0 to SU3 are respectively coupled in common select gate lines SGD0 to SGD3. The control gates of memory cell transistors MT0 to MT7 are respectively coupled in common to word lines WL0 to WL7. The gates of the select transistors ST2 are coupled in common to the select gate line SGS.

In the circuit configuration of the memory cell array 10 described in the above, a plurality of NAND strings NS assigned the same column address CA are coupled in common to the same bit line BL among a plurality of blocks BLK. The source line SL is shared by a plurality of blocks BLK.

A set of memory cell transistors MT coupled to a common word line WL in a single string unit SU is referred to as, for example, a cell unit CU. For example, the storage capacity of a cell unit CU including memory cell transistors MT, which individually store 1-bit data, is defined as "1-page data". The cell unit CU may have a storage capacity of 2-page data or more in accordance with the number of bits stored in the memory cell transistors MT.

The circuit configuration of the memory cell array 10 included in the semiconductor memory device 1 according to the embodiment is not limited to the configuration described in the above. For example, the numbers of memory cell transistors MT, select transistors ST1, and select transistors ST2 in each NAND string NS may be any number. The number of string units SU included in each block BLK may be any number.

<1-1-3> Planar Layout of Memory Cell Array

<1-1-3-1> Overview

FIG. 3 is a plan view showing a layout of the memory cell array 10 included in the semiconductor memory device 1 according to the embodiment.

As shown in FIG. 3, in the memory cell array 10, a step area C2 is provided on one side extending in the X axis of the cell area C1, a dummy step area C3 is provided on one side extending along the Y axis of the cell area C1, and a dummy step area C4 is provided on another side extending along the Y axis of the cell area C1.

<1-1-3-2> Cell Area

A configuration of the cell area C1 according to the embodiment will be described with reference to FIGS. 4 to 6.

Hereinafter, in the drawings to be referred to, the Y direction corresponds to the direction in which word lines WL extend. The X direction corresponds to the direction in which bit lines BL extend. The Z direction corresponds to the direction perpendicular to the surface of a semiconductor substrate on which the semiconductor memory device 1 is formed.

Figure 4:
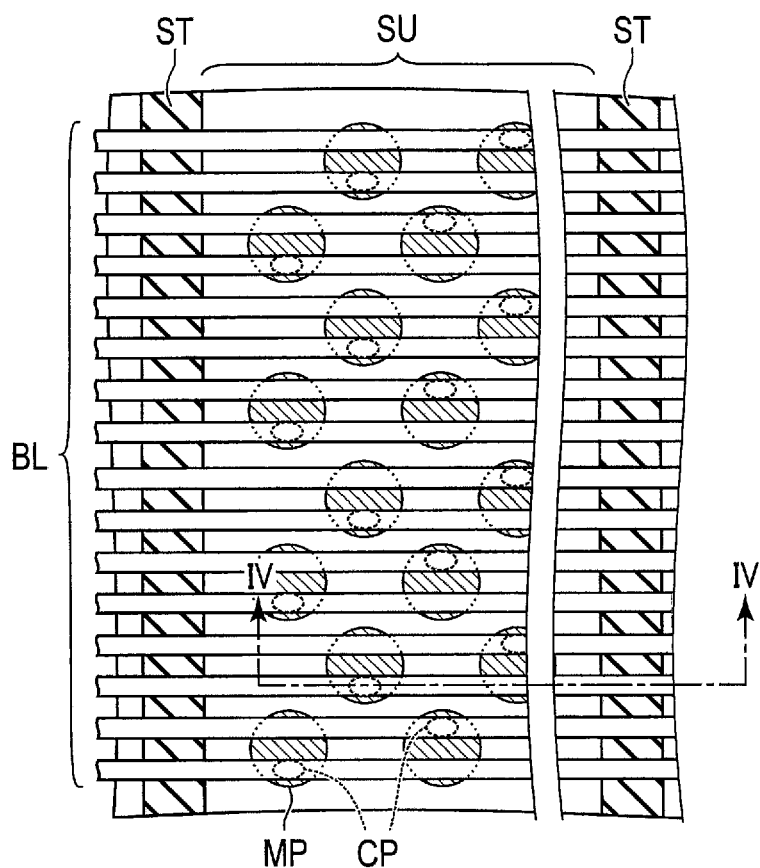
FIG. 4 is a plan view showing a layout of a part of a cell area C1 shown as C in FIG. 3.

FIG. 4 is a plan view showing a layout of C in FIG. 3, that is, the cell area C1.

The cell area C1 is an area in which the memory pillars MP corresponding to the NAND strings NS are formed.

As shown in FIG. 4, the area in which the cell area C1 is formed includes, for example, the plurality of slits ST, the plurality of string units SU, and the plurality of bit lines BL.

The slits ST each extend in the Y direction, and are arranged in the X direction. For example, one string unit SU is disposed between the slits ST adjacent to each other in the X direction.

Each string unit SU includes a plurality of memory pillars MP. The memory pillars MP are arranged, for example, in a staggered pattern in the X direction. Each memory pillar MP functions as, for example, a single NAND string NS.

The bit lines BL extend in the Y direction, and are arranged in the X direction. For example, each bit line BL is disposed to overlap at least one memory pillar MP in each string unit SU. Specifically, for example, two bit lines BL overlap each memory pillar MP.

A contact plug CP is provided between a memory pillar MP and one of the bit lines BL that overlap the memory pillar MP. Each memory pillar MP is electrically coupled to the corresponding bit line BL with a contact plug CP intervening therebetween.

The number of string units SU provided between adjacent slits ST may be any number. The number and arrangement of memory pillars MP shown in FIG. 4 are mere examples, and may be determined at will. The number of bit lines BL that overlap each memory pillar MP may be any number.

Figure 5:
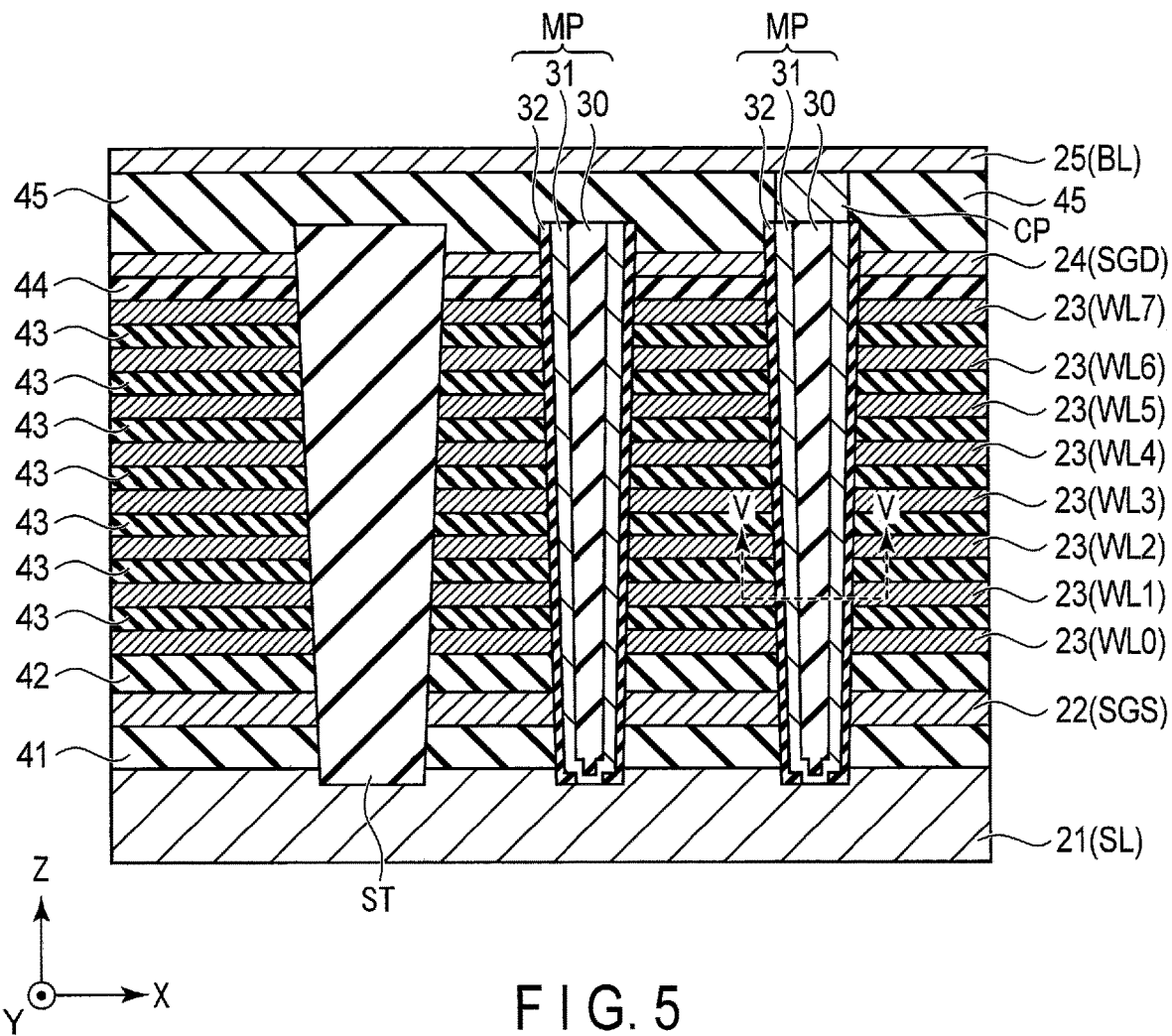
FIG. 5 is a cross-sectional view showing a configuration of the cell area C1 in the semiconductor memory device 1 according to the embodiment.

FIG. 5 is a cross-sectional view taken along line IV-IV in FIG. 4, and shows a configuration of the cell area C1 included in the semiconductor memory device 1 according to the embodiment.

As shown in FIG. 5, the area in which the cell area C1 is formed includes, for example, conductive layers 21 to 25, a memory pillar MP, a contact plug CP, and a slit ST.

Specifically, the conductive layer 21 is provided above a semiconductor substrate (not illustrated). For example, the conductive layer 21 is formed into a shape of a plate expanding on an X-Y plane, and is used as the source line SL. The conductive layer 21 includes, for example, silicon (Si).

Above the conductive layer 21, a conductive layer 22 is provided with an insulating film 41 intervening therebetween. For example, the conductive layer 22 is formed into, for example, a shape of a plate extending in the X-Y plane, and is used as the select gate line SGS. The conductive layer 22 includes, for example, silicon (Si).

Above the conductive layer 22, conductive layers 23 and insulating films 43 are alternately stacked with an insulating film 42 intervening between the conductive layer 22 and these stacked conductive layers 23 and insulating films 43. For example, the conductive layer 23 is formed into a shape of a plate expanding on the X-Y plane. The stacked conductive layers 23 are used as, in the order from the side of the semiconductor substrate 20, word lines WL0 to WL7. The conductive layers 23 include, for example, tungsten (W).

Above the topmost conductive layer 23, a conductive layer 24 is provided with an insulating film 44 intervening therebetween. The conductive layer 24 is formed into, for example, a shape of a plate expanding on the XY plane, and is used as a select gate line SGD. The conductive layer 24 includes, for example, tungsten (W).

Above the conductive layer 24, a conductive layer 25 is provided with an insulating film 45 intervening therebetween. The conductive layer 25 is formed into, for example, a line shape extending in the X direction, and is used as a bit line BL. That is, a plurality of conductive layers 25 are aligned in the Y direction in an unillustrated area. The conductive layer 25 includes, for example, copper (Cu).

The memory pillar MP is formed into a shape of a pillar extending in the Z direction and penetrates, for example, the conductive layers 22 to 24. Specifically, the upper end of the memory pillar MP is included in, for example, a layer between the layer in which the conductive layer 24 is provided and the layer in which the conductive layer 25 is provided. The lower end of the memory pillar MP is included in, for example, a layer in which the conductive layer 21 is provided.

The insulating films 41 to 45, include, for example, silicon oxide ($SiO_2$).

As shown in FIG. 6, the memory pillar MP includes, for example, a core member 30, a semiconductor layer 31, and a stacked film 32.

The core member 30 is formed into a shape of a pillar extending in the Z direction. The upper end of the core member 30 is included in, for example, a layer above the layer in which the conductive layer 24 is provided. The lower end of the core member 30 is included in, for example, the layer in which the conductive layer 21 is provided. The core member 30 includes an insulator such as silicon oxide ($SiO_2$).

The core member 30 is covered with the semiconductor layer 31. The bottom of the semiconductor layer 31 is in contact with the conductive layer 21. The semiconductor layer 31 is, for example, polysilicon (Si). The stacked film 32 covers a side surface and a bottom surface of the semiconductor layer 31 except for a portion in which the conductive layer 21 and the semiconductor layer 31 are in contact with each other.

In a layer including the conductive layer 23, the core member 30 is provided in the middle of the memory pillar MP. The semiconductor layer 31 surrounds the side surface of the core member 30. The stacked film 32 surrounds the side surface of the semiconductor layer 31. The stacked film 32 includes, for example, a tunnel insulating film 33, an insulating film 34, and a block insulating film 35.

The tunnel insulating film 33 surrounds the side surface of the semiconductor layer 31. The insulating film 34 surrounds the side surface of the tunnel insulating film 33. The block insulating film 35 surrounds the side surface of the insulating film 34. The conductive layer 23 surrounds the side surface of the block insulating film 35.

The tunnel insulating film 33 includes, for example, silicon oxide ($SiO_2$). The insulating film 34 includes, for example, silicon nitride (SiN). The block insulating film 35 includes, for example, silicon oxide ($SiO_2$).

Referring back to FIG. 4, pillar-shaped contact plugs CP are provided on the semiconductor layer 31. In an illustrated area, a contact plug CP corresponding to one of the two memory pillars MP is shown. To the other memory pillar MP to which the contact plug CP is not coupled in the illustrated area, a contact pillar CP is coupled in an unillustrated area.

A top surface of the contact plug CP is in contact with one of the conductive layers 25, namely, one of the bit lines BL. The memory pillar MP and the conductive layer 25 may be electrically coupled to each other with two or more contact plugs intervening therebetween, or with another interconnect intervening therebetween.

The slit ST is formed into a shape of a plate extending in the Z direction and splits, for example, the conductive layers 22 to 24. Specifically, the upper end of the slit ST is included in, for example, a layer between the layer in which the upper end of the memory pillar MP is included and the layer in which the conductive layer 25 is provided.

An insulator is provided inside the slit ST. The insulator includes an insulator such as silicon oxide ($SiO_2$). Multiple types of insulators may form the inside of the slit ST. For example, silicon nitride (SiN) may be formed as a side wall of the slit ST before silicon oxide is embedded in the slit ST.

In the configuration of the memory pillar MP described in the above, for example, a portion in which the memory pillar MP intersects the conductive layer 22 functions as a select transistor ST2. A portion in which the memory pillar MP intersects the conductive layer 23 functions as the memory cell transistor MT. A portion in which the memory pillar MP intersects the conductive layer 24 functions as the select transistor ST1.

Namely, the semiconductor layer 31 is used as a channel of each of the memory cell transistors MT and the select transistors ST1 and ST2. The insulating film 34 is used as the charge storage layer of each memory cell transistor MT.

In the configuration of the memory cell array 10 described in the above, the number of conductive layers 23 is designed based on the number of word lines WL. A plurality of conductive layers 24 respectively provided in a plurality of layers may be assigned to each select gate line SGD. A plurality of conductive layers 22 respectively provided in a plurality of layers may be assigned to each select gate line SGS. In the case where select gate lines SGS are respectively provided in a plurality of layers, a conductor different from the conductive layer 22 may be used.

<1-1-3-3> Step Area

A configuration of the step area C2 according to the embodiment will be described with reference to FIG. 7.

Figure 7:
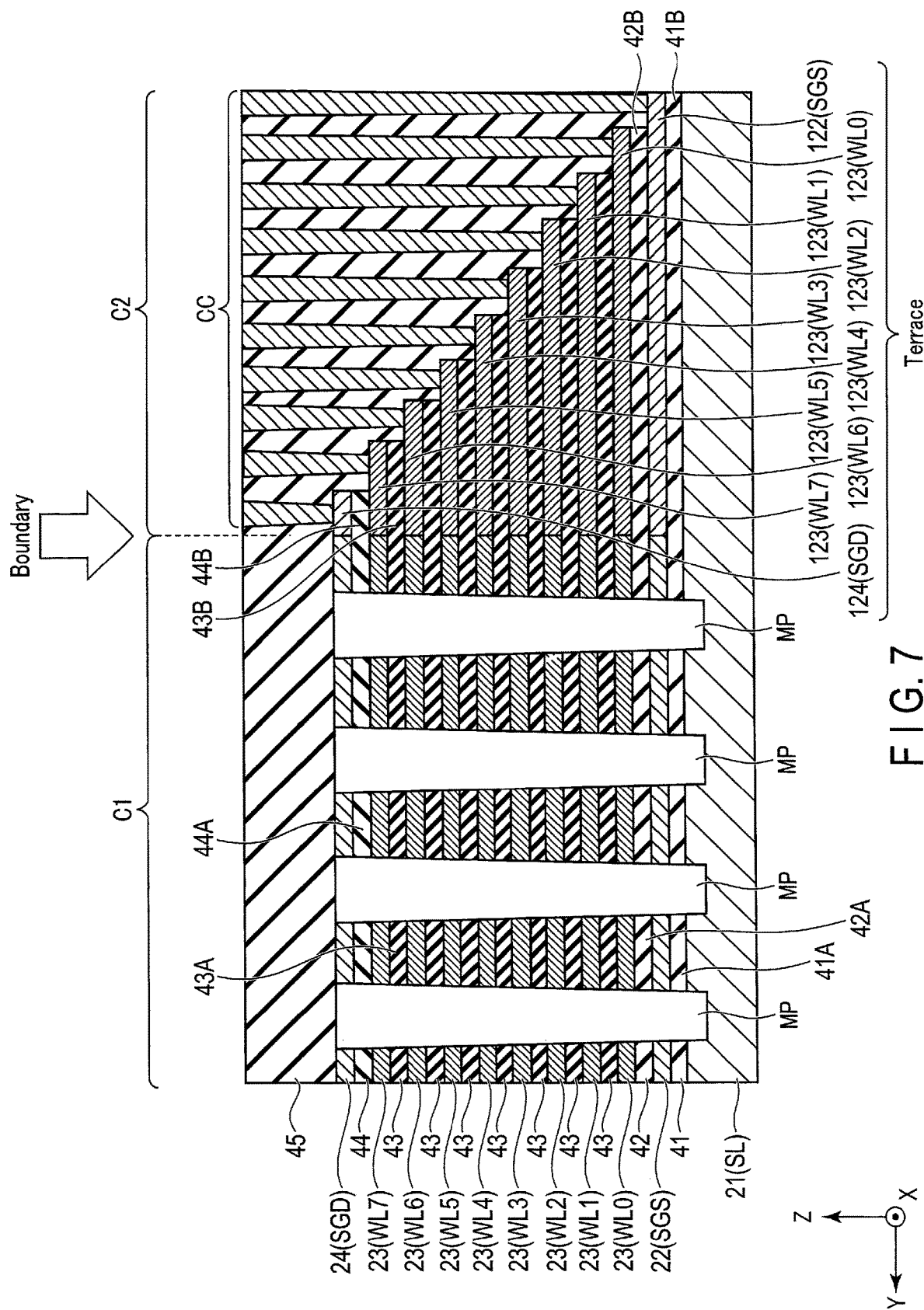
FIG. 7 is a cross-sectional view taken along line A-A' showing a configuration of the memory cell array 10 shown in FIG. 3.

FIG. 7 is a cross-sectional view taken along line A-A' in FIG. 3, that is, a cross-sectional view of the step area C2. The step area C2 is an area in which the plurality of conductive layers 22 to 24 corresponding to the select gate lines SGD and SGS and the word lines WL0 to WL7 are led out in a stepwise manner (hereinafter, a leading portion will be referred to as a "terrace" or "projecting portion"). A contact plug CC is formed on each terrace. The contact plug CC is coupled to a row decoder module 15 with an interconnect layer (not illustrated) provided on the upper end. The contact plug CC is formed of a conductive material, and may be formed using a metallic material such as tungsten (W) or titanium nitride (TiN).

Specifically, as shown in FIG. 7, as the select gate line SGS, the conductive layer 22 is used in the cell area C1 and the conductive layer 122 is provided in the step area C2. The conductive layer 22 and the conductive layer 122 are coupled to a boundary between the cell area C1 and the step area C2. This conductive layer 122 functions as a terrace of the select gate line SGS and is coupled to the contact plug CC extending in the Z axis. This conductive layer 122 includes, for example, polysilicon.

As the word lines WL0 to WL7, the conductive layer 23 is used in the cell area C1 and the conductive layer 123 is provided in the step area C2. The conductive layer 23 and the conductive layer 123 are coupled to a boundary between the cell area C1 and the step area C2. This conductive layer 123 functions as a terrace of each of the word lines WL0 to WL7 and is coupled to the contact plug CC extending in the Z axis. This conductive layer 123 includes, for example, polysilicon. The conductive layers 123 may contain impurities (for example, tungsten).

As the select gate line SGD, the conductive layer 24 is used in the cell area C1 and the conductive layer 124 is provided in the step area C2. The conductive layer 24 and the conductive layer 124 are coupled to a boundary between the cell area C1 and the step area C2. This conductive layer 124 functions as a terrace of the select gate line SGD and is coupled to the contact plug CC extending in the Z axis. This conductive layer 124 includes, for example, polysilicon.

The insulating films 41 to 44 provided in the cell area C1 are respectively labeled as the insulating films 41A to 44A, and the insulating films 41 to 44 provided in the step area C2 are respectively labeled as the insulating films 41B to 44B.

<1-1-3-4> Dummy Step Area

A configuration of the dummy step area C4 according to the embodiment will be described with reference to FIG. 8.

Figure 8:
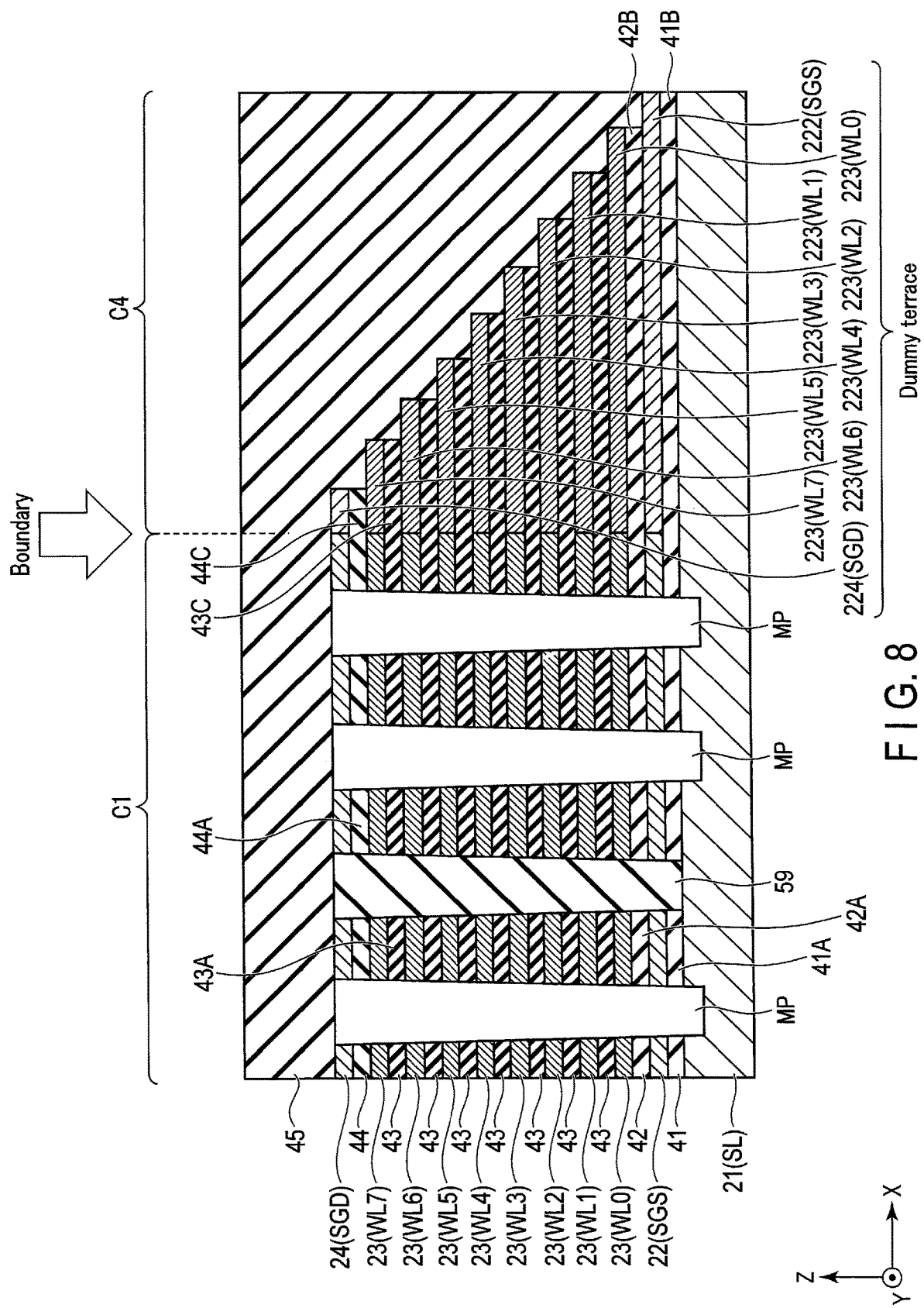
FIG. 8 is a cross-sectional view taken along line B-B' showing a configuration of the memory cell array 10 shown in FIG. 3.

FIG. 8 is a cross-sectional view taken along line B-B' in FIG. 3, that is, a cross-sectional view of the dummy step area C4. The dummy step area C4 is an area in which the plurality of conductive layers 22 to 24 corresponding to the select gate lines SGD and SGS and the word lines WL0 to WL7 are led out in a stepwise manner. A leading area in the dummy step area C4 will be referred to as a dummy terrace, etc. The difference between the step area C2 and the dummy step area C4 is that each dummy terrace is not provided with the contact plug CC.

Specifically, as shown in FIG. 8, as the select gate line SGS, the conductive layer 22 is used in the cell area C1 and the conductive layer 222 is provided in the dummy step area C4. The conductive layer 22 and the conductive layer 222 are coupled to a boundary between the cell area C1 and the dummy step area C4. This conductive layer 222 functions as a dummy terrace of the select gate line SGS and includes, for example, polysilicon.

As the word lines WL0 to WL7, the conductive layer 23 is used in the cell area C1 and the conductive layer 223 is provided in the dummy step area C4. The conductive layer 23 and the conductive layer 223 are coupled to a boundary between the cell area C1 and the dummy step area C4. This conductive layer 223 functions as a dummy terrace of each of the word lines WL0 to WL7 and includes, for example, polysilicon.

As the select gate line SGD, the conductive layer 24 is used in the cell area C1 and the conductive layer 224 is provided in the dummy step area C4. The conductive layer 24 and the conductive layer 224 are coupled to a boundary between the cell area C1 and the dummy step area C4. This conductive layer 224 functions as a dummy terrace of the select gate line SGD and includes, for example, polysilicon.

The insulating films 41 to 44 provided in the dummy step area C4 are respectively labeled as the insulating films 41B to 44B.

The above applies to another dummy step area C3.

<1-1-3-5> Word Line

Herein, the word line WL6 provided in the cell area C1, the step area C2, and the dummy step areas C3 and C4 will be described with reference to FIG. 9.

Figure 9:
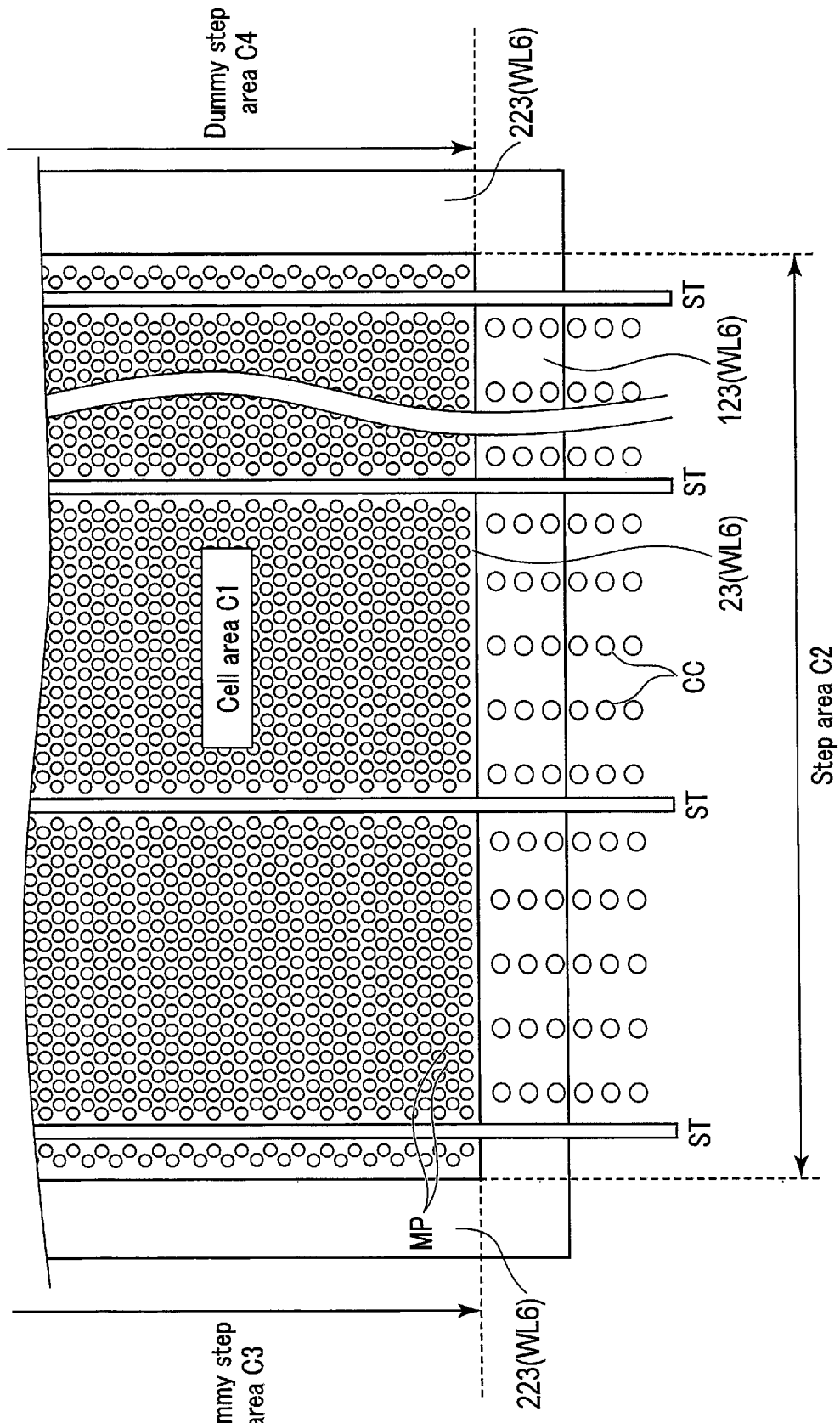
FIG. 9 is a plan view showing a word line WL6 of the memory cell array 10 included in the semiconductor memory device 1 according to the embodiment.

As shown in FIG. 9, the word line WL6 is a plate-like conductive layer and is formed across the cell area C1, the step area C2, and the dummy step areas C3 and C4. The word line WL6 positioned in the cell area C1 is labeled as 23, the word line WL6 positioned in the step area C2 is labeled as 123, and the word line WL6 positioned in the dummy step areas C3 and C4 is labeled as 223.

<1-2> Method of Manufacturing Semiconductor Memory Device 1

Figure 10:
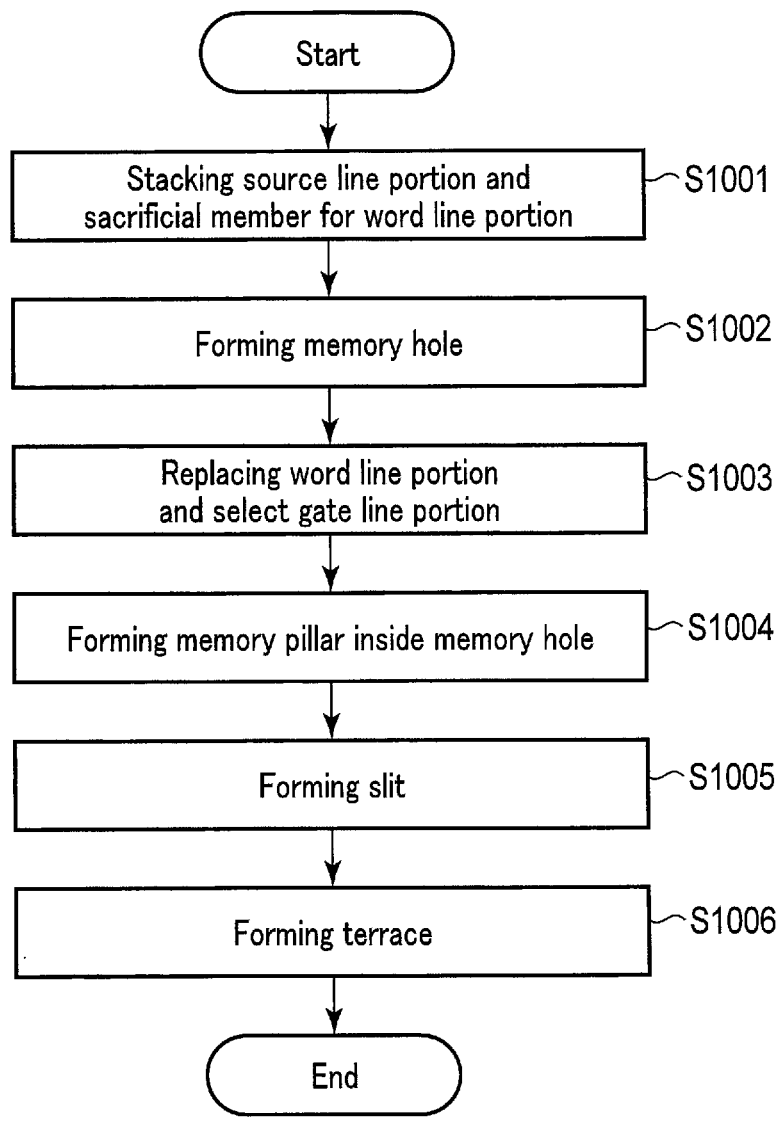
FIG. 10 is a flowchart for illustrating a step of manufacturing the semiconductor memory device 1 according to the embodiment.

Hereinafter, a series of manufacturing steps from formation of a stacked structure corresponding to the word lines to formation of the slit ST in the semiconductor memory device 1 according to the embodiment will be described by referring to FIG. 10 as appropriate. FIG. 10 is a flowchart showing a method of manufacturing the semiconductor memory device 1 according to the embodiment. FIGS. 11 to 16 each show a configuration including a structure corresponding to the cell area C1 and the dummy step area C4 in a step of manufacturing the semiconductor memory device 1 according to the embodiment.

[Step S1001]

Figure 11:
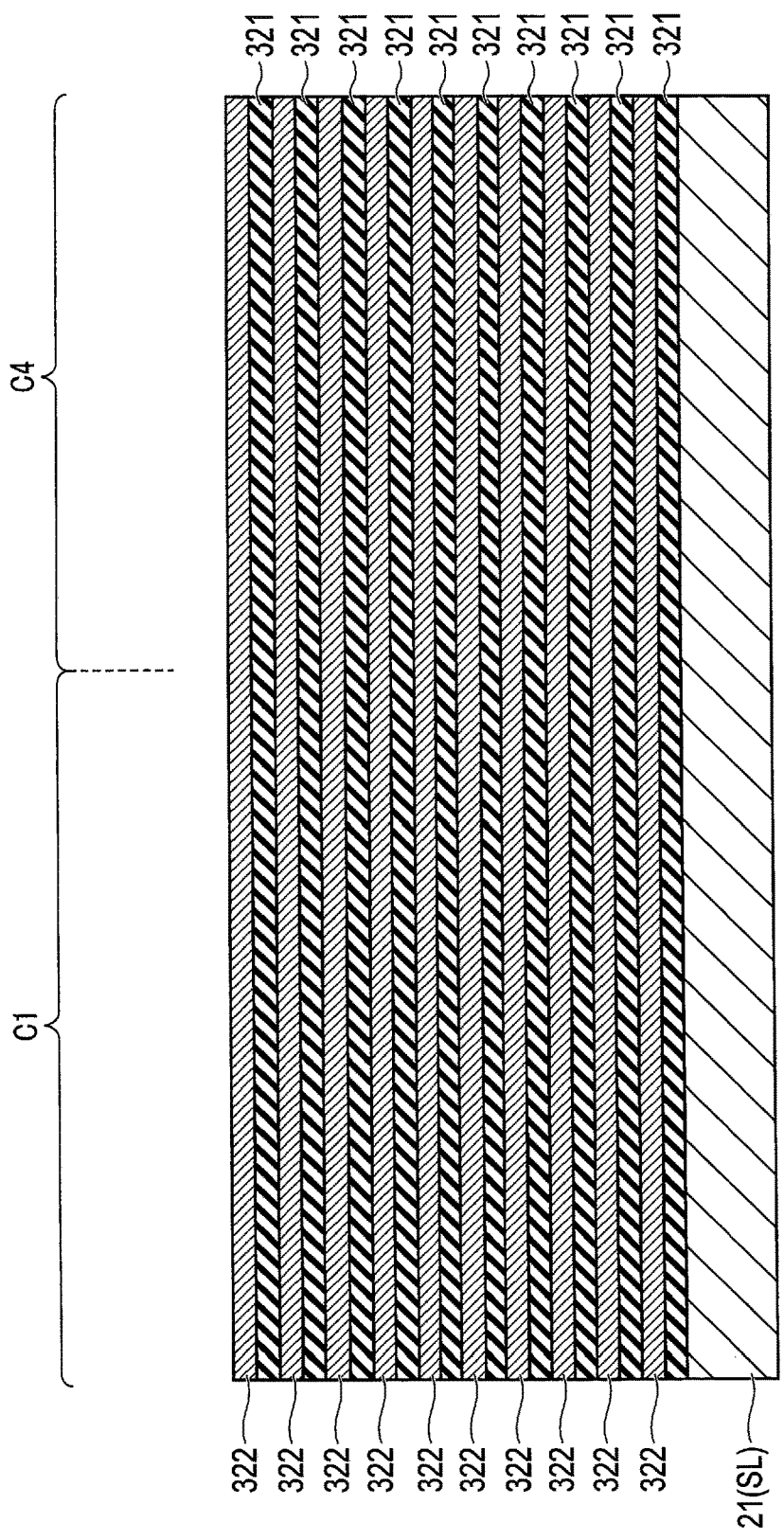
FIG. 11 is a cross-sectional view of the memory cell array 10 for illustrating a step of manufacturing the semiconductor memory device 1 according to the embodiment.

A source line portion and sacrificial members for a word line portion are stacked above a semiconductor substrate (not illustrated). Specifically, as illustrated in FIG. 11, the conductive layer 21 is formed above the semiconductor substrate (not illustrated). Insulating layers 321 and sacrificial members 322 are alternately stacked on the conductive layer 21.

The conductive layer 21 corresponds to the source line portion. The conductive layer 21 includes, for example, polysilicon (Si). The insulating layer 321 contains, for example, silicon oxide ($SiO_2$). For example, the insulating layers 321 have a film thickness of 15 nm or lower. The respective sacrificial members 322 are replaced with select gate lines and word lines. For example, the number of layers that form the sacrificial members 322 corresponds to the number of stacked select gate lines and word lines WL. The sacrificial members 322 include, for example, polysilicon.

[Step S1002]

Figure 12:
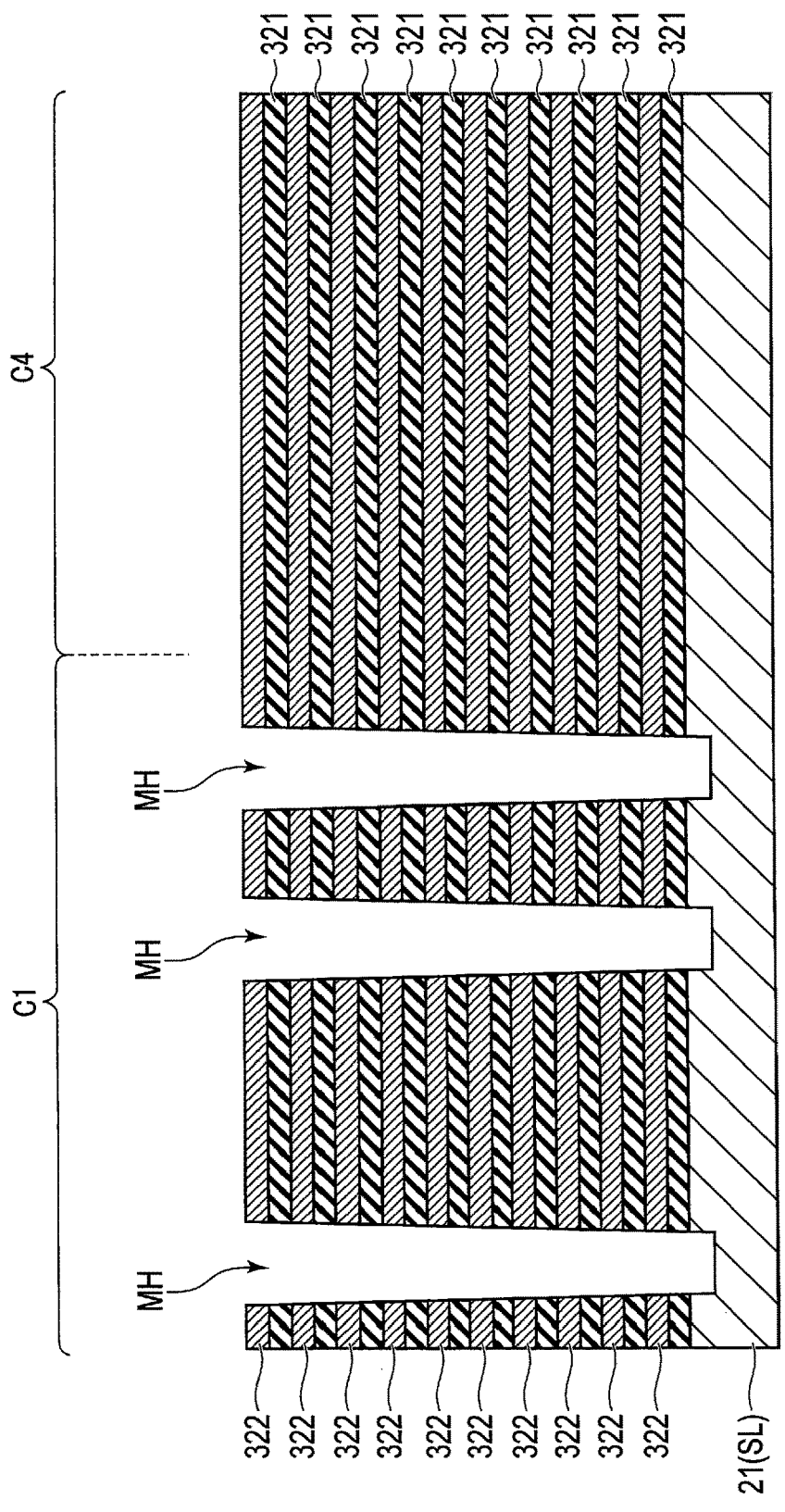
FIG. 12 is a cross-sectional view of the memory cell array 10 for illustrating a step of manufacturing the semiconductor memory device 1 according to the embodiment.

Next, a memory hole MH is formed. Specifically, a mask (not illustrated) including opening regions corresponding to memory holes MH is formed by, for example, photolithography. Then, as shown in FIG. 12, memory holes MH are formed by anisotropic etching using the formed mask.

The memory hole MH formed in this step penetrates each of the insulating layers 321 and sacrificial members 322, and a bottom of the memory hole MH stops within the conductive layer 21, for example. The anisotropic etching in this step is, for example, reactive ion etching (RIE).

[Step S1003]

Figure 13:
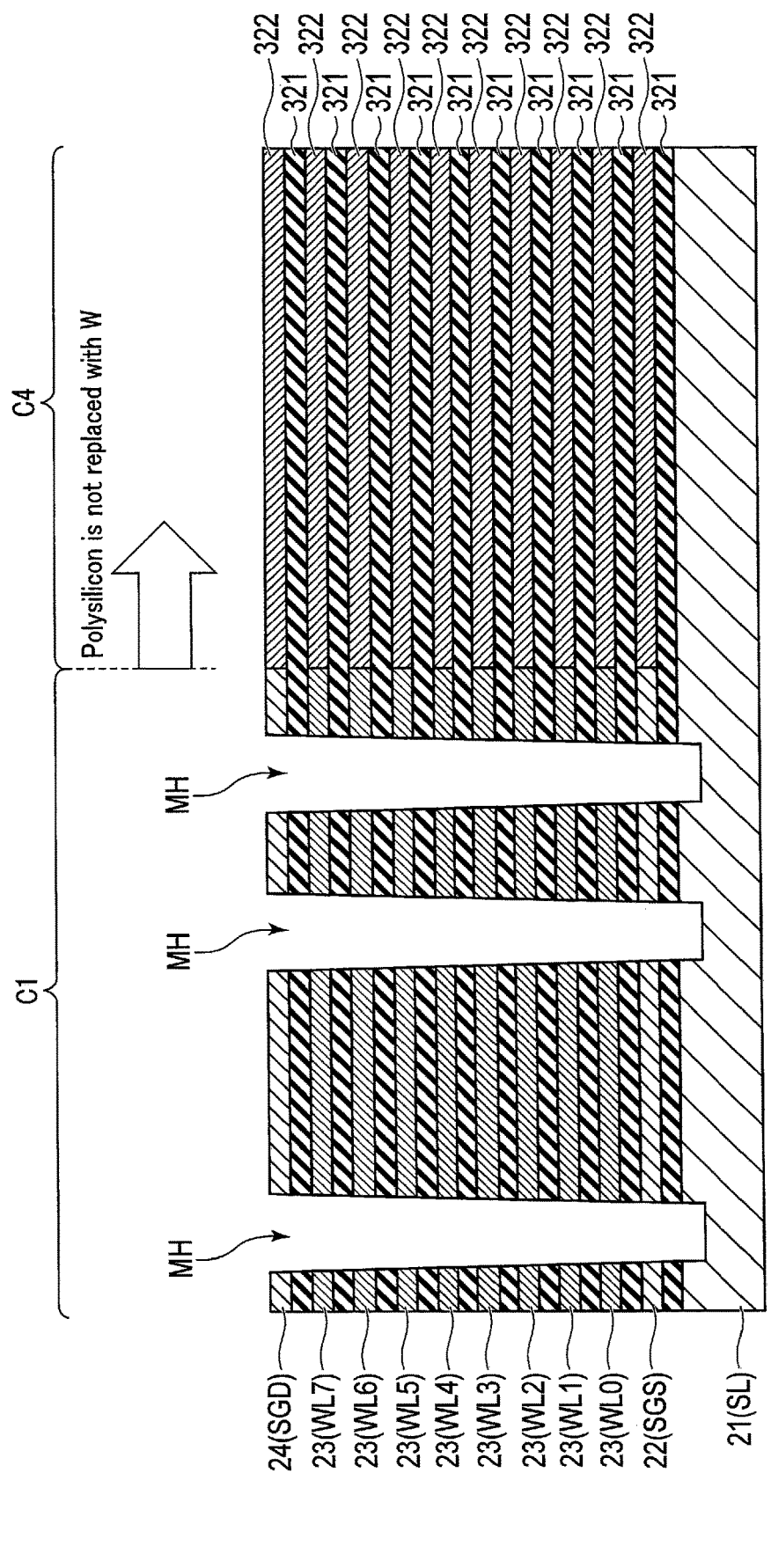
FIG. 13 is a cross-sectional view of the memory cell array 10 for illustrating a step of manufacturing the semiconductor memory device 1 according to the embodiment.

Next, replacement processing for the word line portions and select gate line portions is performed. Specifically, as shown in FIG. 13, the sacrificial members 322 exposed within the memory hole MH are subjected to tungsten hexafluoride ($WF_6$) gas. In this manner, polysilicon of the sacrificial members 322 exposed within the memory hole MH is replaced with tungsten (W). This forms the plurality of conductive layers 23 respectively corresponding to the word lines WL0 to WL7, and the conductive layers 22 and 24 respectively corresponding to the select gate lines SGS and SGD. In the conductive layers 22 to 24, polysilicon is replaced with tungsten (W); however, silicon (Si) may remain at an impurity level.

Meanwhile, tungsten hexafluoride ($WF_6$) gas does not reach the sacrificial members 322 in the dummy step area C4, so that polysilicon remains without being replaced with tungsten (W).

[Step S1004]

Figure 14:
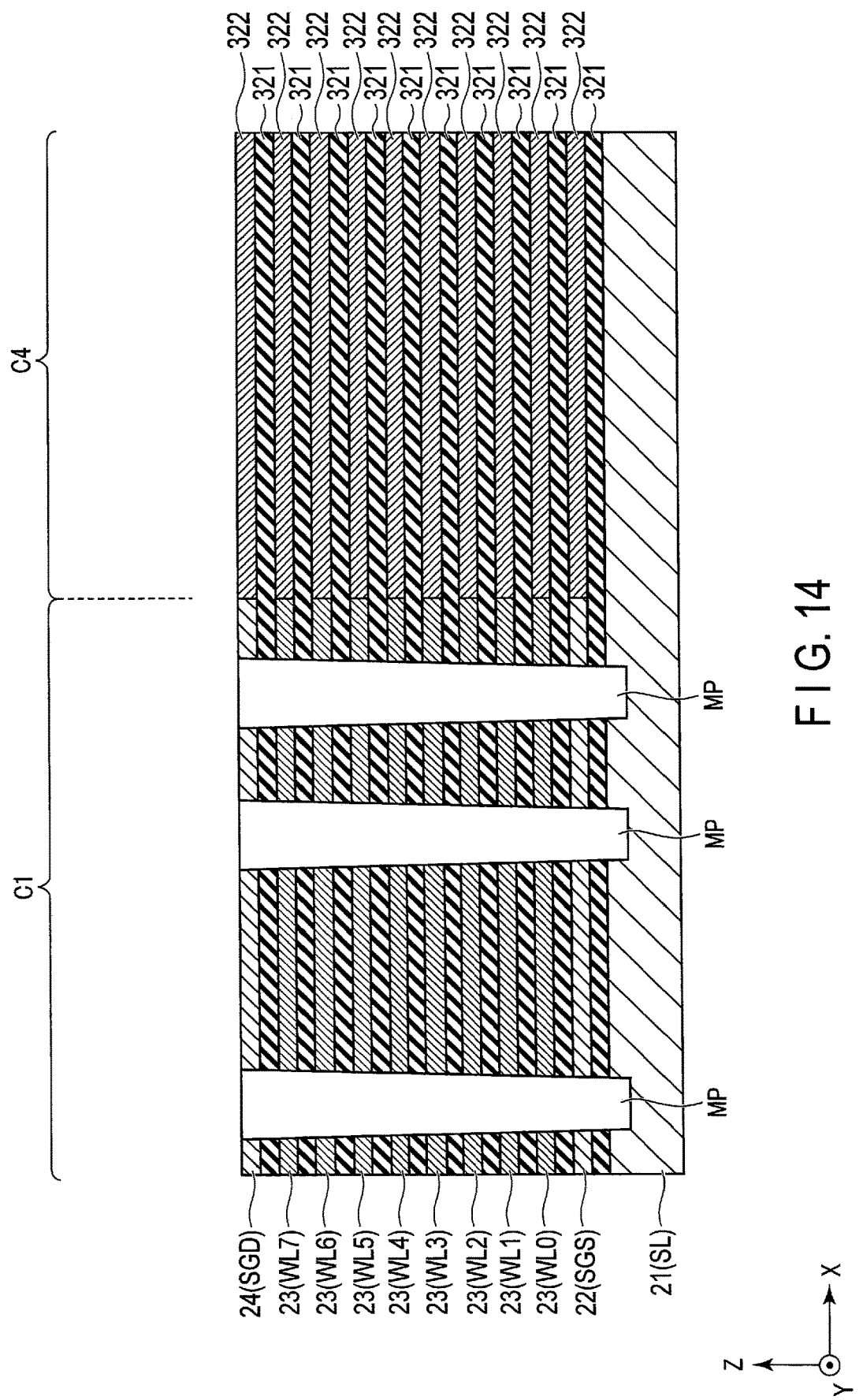
FIG. 14 is a cross-sectional view of the memory cell array 10 for illustrating a step of manufacturing the semiconductor memory device 1 according to the embodiment.

The memory pillars MP are formed in the memory holes MH. Specifically, as shown in FIG. 14, the block insulating film 35 (silicon oxide ($SiO_2$)) is formed on the side surface and the bottom surface of each memory hole MH, silicon nitride is formed as the insulating film 34 on the block insulating film 35, silicon oxide ($SiO_2$) is formed as the tunnel insulating film 33 on the insulating film 34, silicon (Si) is formed as the semiconductor layer 31 on the tunnel insulating film 33, and an insulating material is formed as the core member 30 on the semiconductor layer 31. In this manner, the memory pillars MP are respectively formed in the memory holes MH.

[Step S1005]

Figure 15:
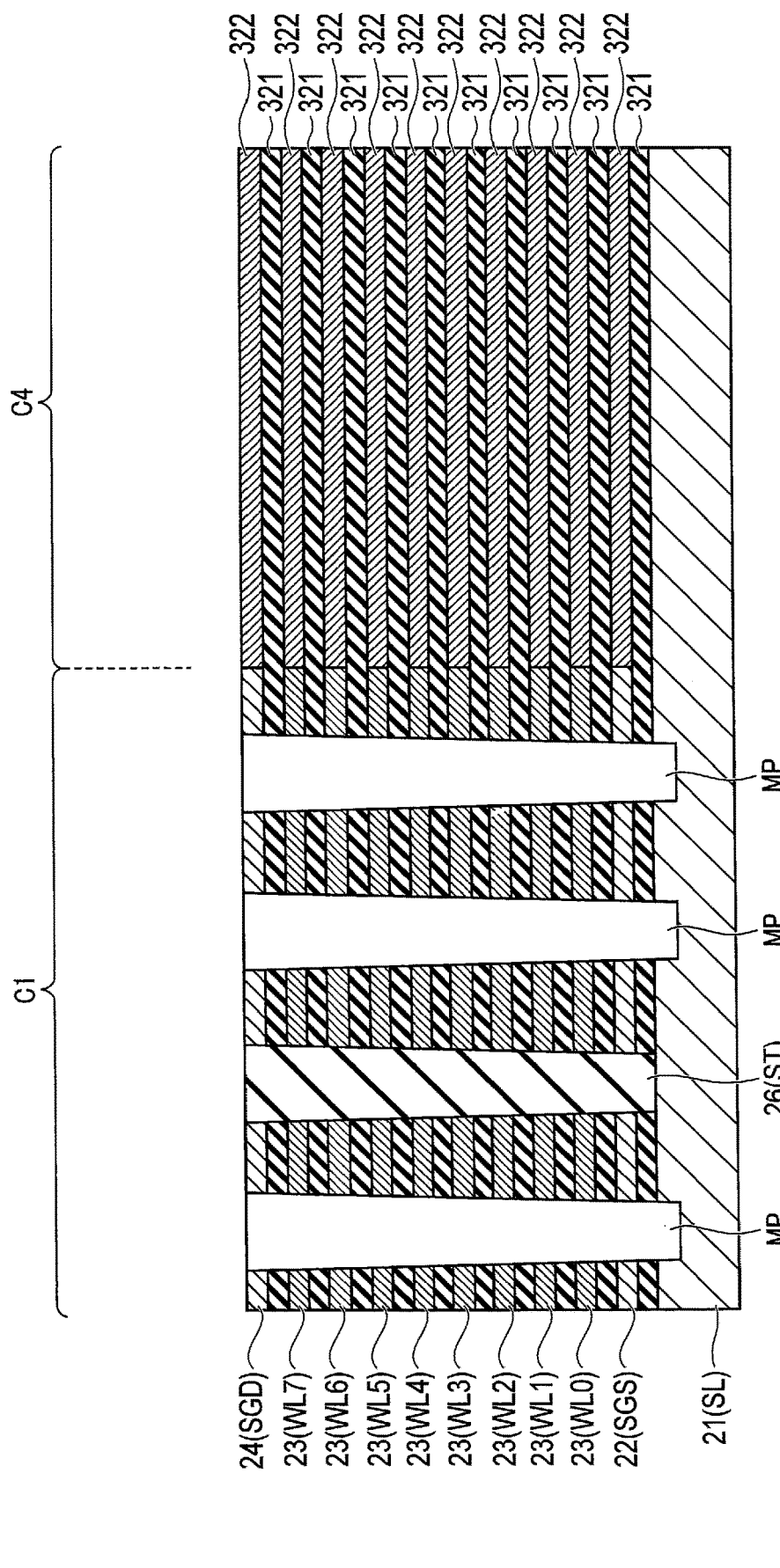
FIG. 15 is a cross-sectional view of the memory cell array 10 for illustrating a step of manufacturing the semiconductor memory device 1 according to the embodiment.

Next, the slits ST are formed. Specifically, first, a mask (not illustrated) in which regions corresponding to the slits ST are opened is formed by photolithography, etc. Then, the slits ST are formed by anisotropic etching using the formed mask, as shown in FIG. 15.

The slit ST formed in this step splits each of the insulating layer 321 and the conductive layers 22 to 24, and the bottom of the slit ST stops within a layer provided with the conductive layer 21, for example. The anisotropic etching in this step is, for example, RIE.

Thereafter, the slits ST are filled with the insulator 26. Then, the insulator 26 formed outside the slits ST is removed by, for example, CMP. As a result, a configuration in which the slits ST are filled with the insulator 26 is formed. The insulator 26 includes, for example, silicon oxide ($SiO_2$).

[Step S1006]

Figure 16:
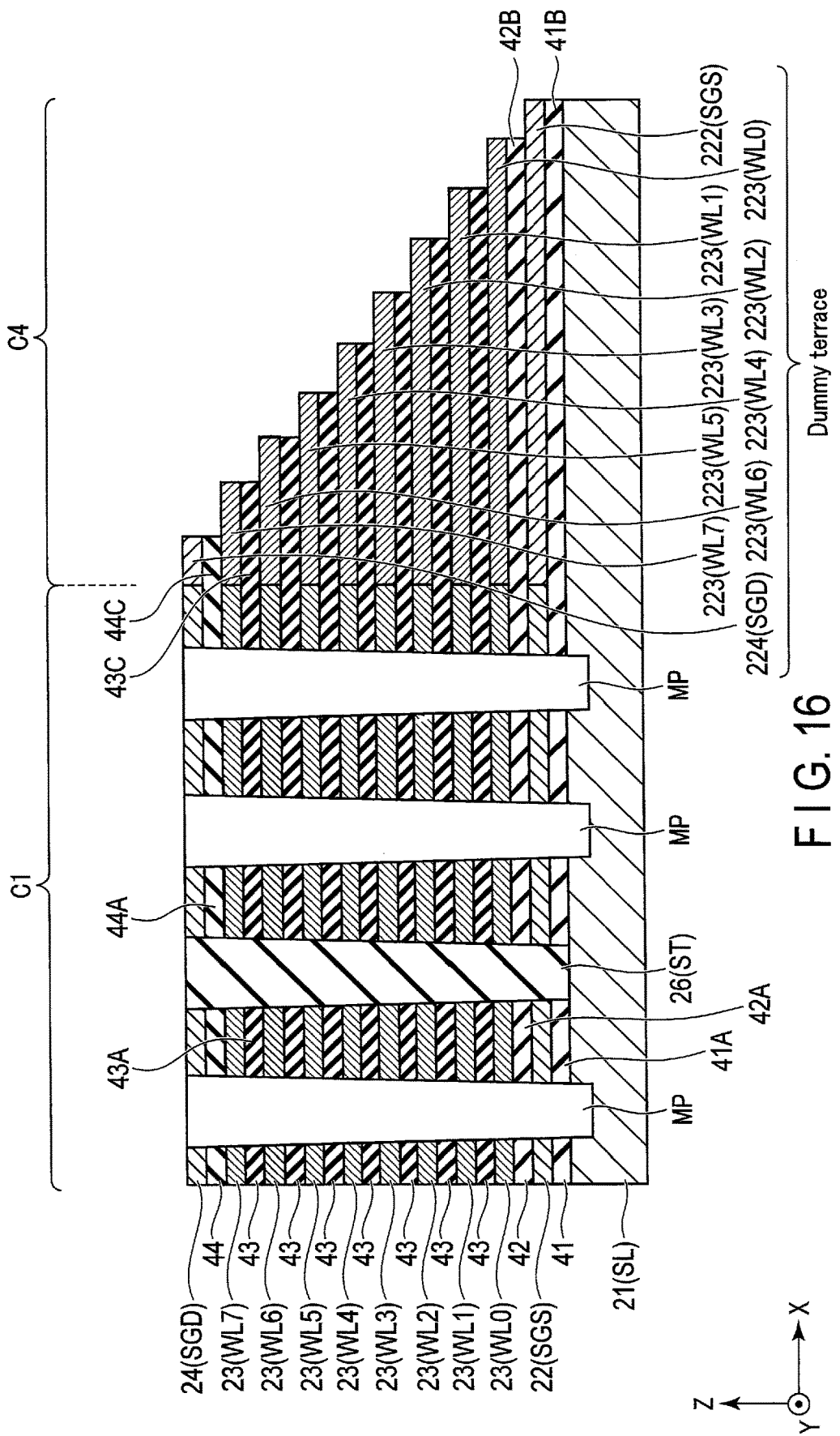
FIG. 16 is a cross-sectional view of the memory cell array 10 for illustrating a step of manufacturing the semiconductor memory device 1 according to the embodiment.

Subsequently, the dummy terraces (terraces) are formed. As shown in FIG. 16, pairs of the conductive layer and the insulating film are subsequently removed in a stepwise manner by anisotropic etching, etc., thereby forming the dummy terraces 222 to 224.

According to the manufacturing steps of the semiconductor memory device 1 of the present embodiment described in the above, each of the memory pillars MP, and the source line SL, the word lines WL, and the select gate lines SGS and SGD, which are coupled to the memory pillars MP, are formed. The manufacturing steps described in the above serve merely as an example. The manufacturing steps may have any processing inserted therebetween, or may be interchanged as long as no problems arise.

The above description is about the dummy step area C4; however, the step area C2 and the dummy step area C3 are formed in a similar manner to the dummy step area C4.

<1-3> Advantages of Embodiment

According to the embodiment described in the above, as the method of forming the stacked structure (the select gate lines and the word lines), silicon oxide ($SiO_2$) and polysilicon are alternatively stacked to form a plurality of layers, and the memory holes MH are formed. Thereafter, polysilicon exposed within the memory holes MH is subjected to tungsten hexafluoride ($WF_6$) gas. Accordingly, polysilicon, which functions as the select gate lines and the word lines, is replaced with tungsten (W).

This achieves a reduced number of the slits ST and a decrease in the support member in the step area and the dummy step areas, thereby shortening a distance between tungsten layers in the Z direction.

To explain the advantageous effects of the present embodiment, a comparative example will be described below.

Figure 17:
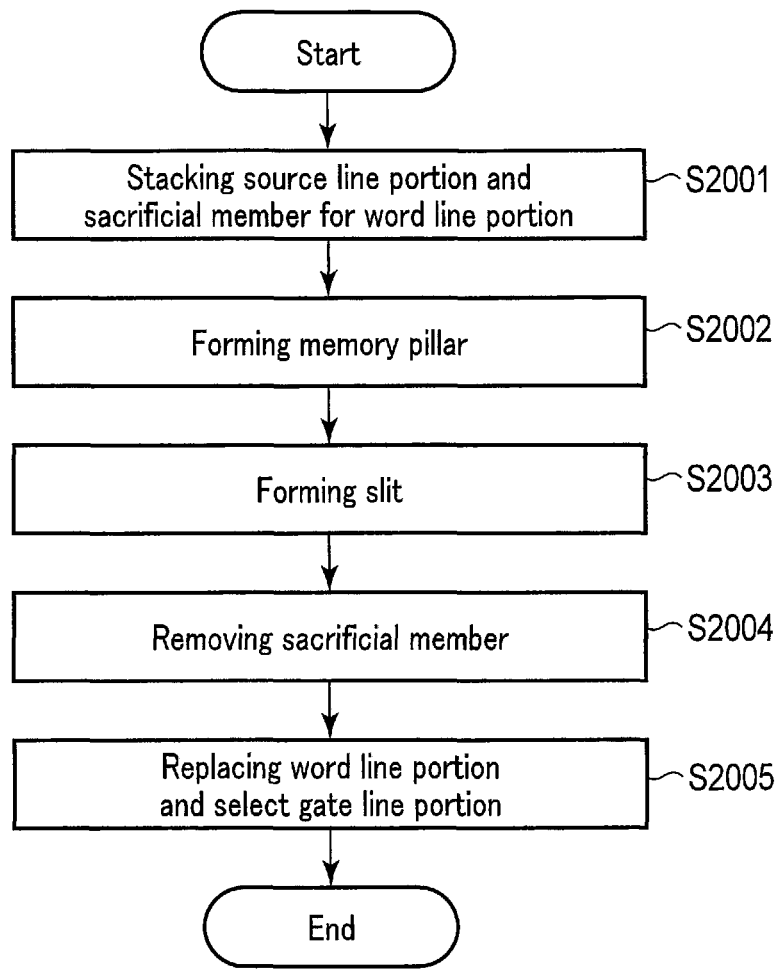
FIG. 17 is a flowchart for illustrating a step of manufacturing the semiconductor memory device 1 according to a comparative example.

Hereinafter, a series of manufacturing steps from formation of a stacked structure corresponding to the word lines to formation of steps in the semiconductor memory device 1 according to a comparative example will be described with reference to FIG. 17 as appropriate. FIG. 17 is a flowchart showing a method of manufacturing the semiconductor memory device 1 according to the comparative example. FIGS. 18 to 23 each present a configuration including a structure corresponding to the cell area C1 and the dummy step area C4 in a step of manufacturing the semiconductor memory device 1 according to the comparative example.

[Step S2001]

Figure 18:
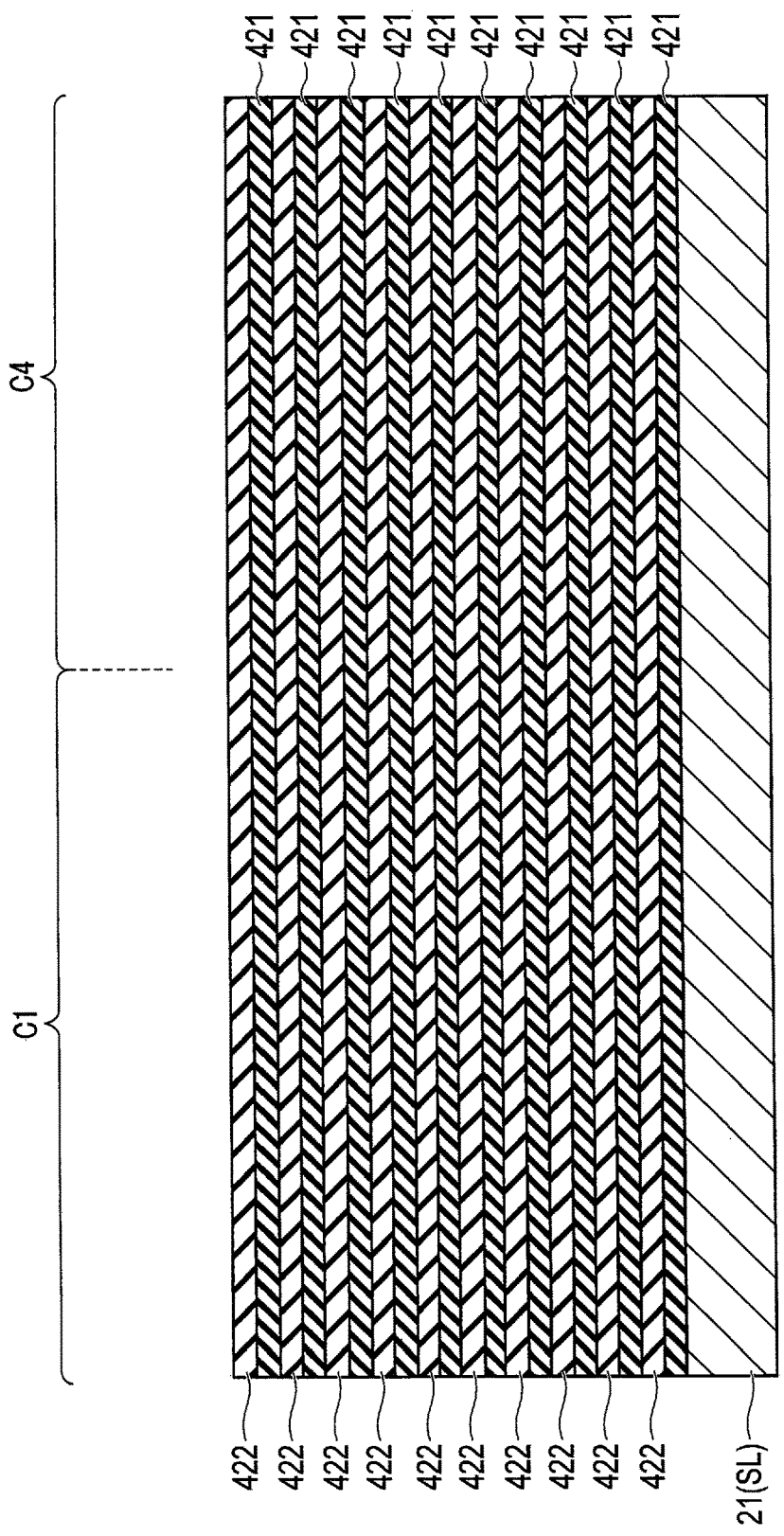
FIG. 18 is a cross-sectional view of the memory cell array 10 for illustrating a step of manufacturing the semiconductor memory device 1 according to the comparative example.

A source line portion and sacrificial members for a word line portion are stacked on the semiconductor substrate. Specifically, as illustrated in FIG. 18, the conductive layer 21 is formed above the semiconductor substrate (not illustrated). Insulating layers 421 and sacrificial members 422 are alternately stacked on the conductive layer 21.

The insulating layers 421 include, for example, silicon oxide ($SiO_2$). Each of the sacrificial members 422 includes, for example, silicon nitride (SiN).

[Step S2002]

Figure 19:
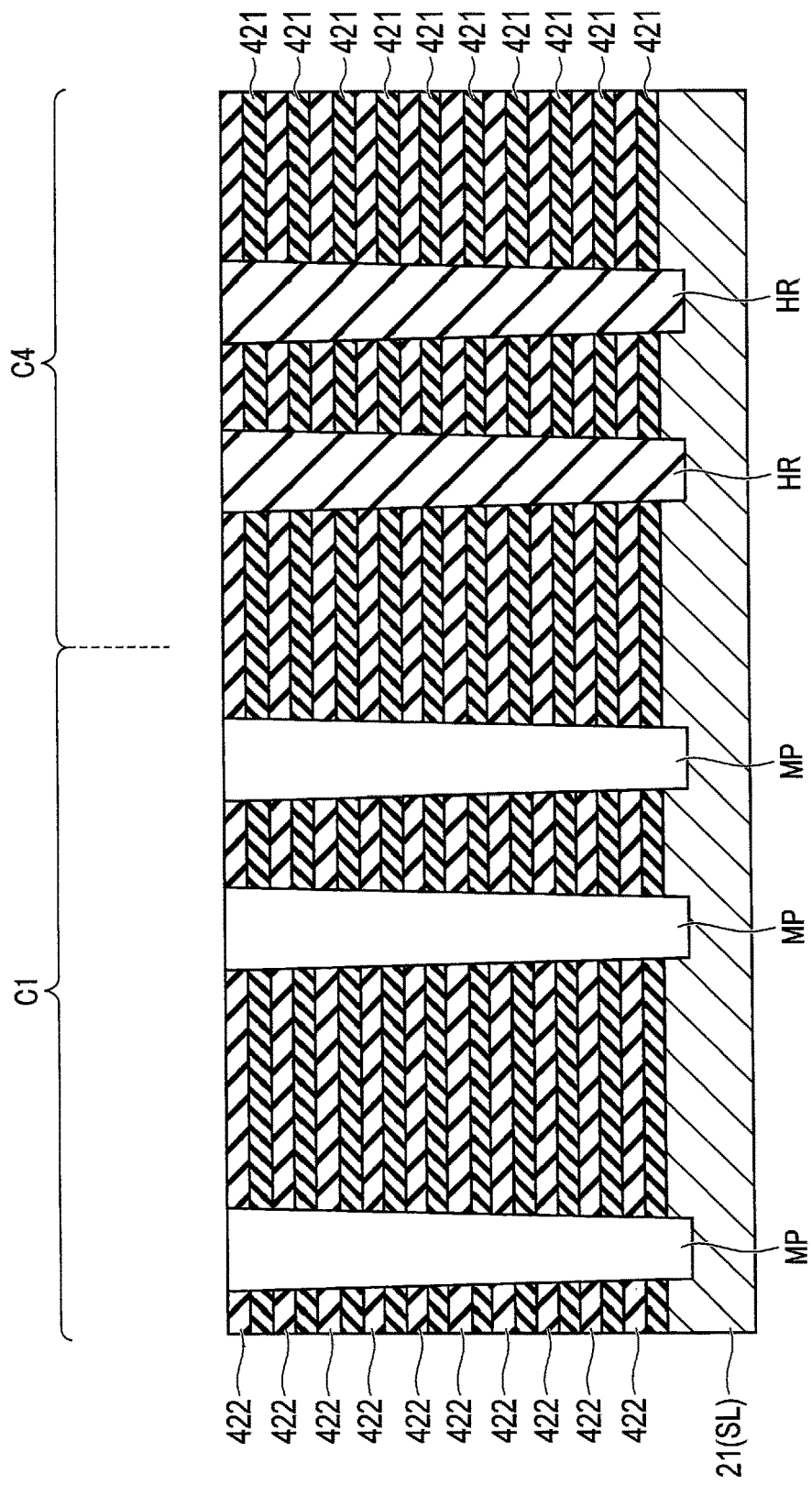
FIG. 19 is a cross-sectional view of the memory cell array 10 for illustrating a step of manufacturing the semiconductor memory device 1 according to the comparative example.

Next, as shown in FIG. 19, the memory pillars MP and support portions HR are formed. The support portions HR correspond to a supporting configuration for preventing a step area not provided with the memory pillar MP from collapsing when the sacrificial members 422 are removed in a later step. The support portions HR correspond to a pillar-shaped insulator extending in the Z axis, for example. The support portions HR are not provided in the embodiment.

[Step S2003]

Figure 20:
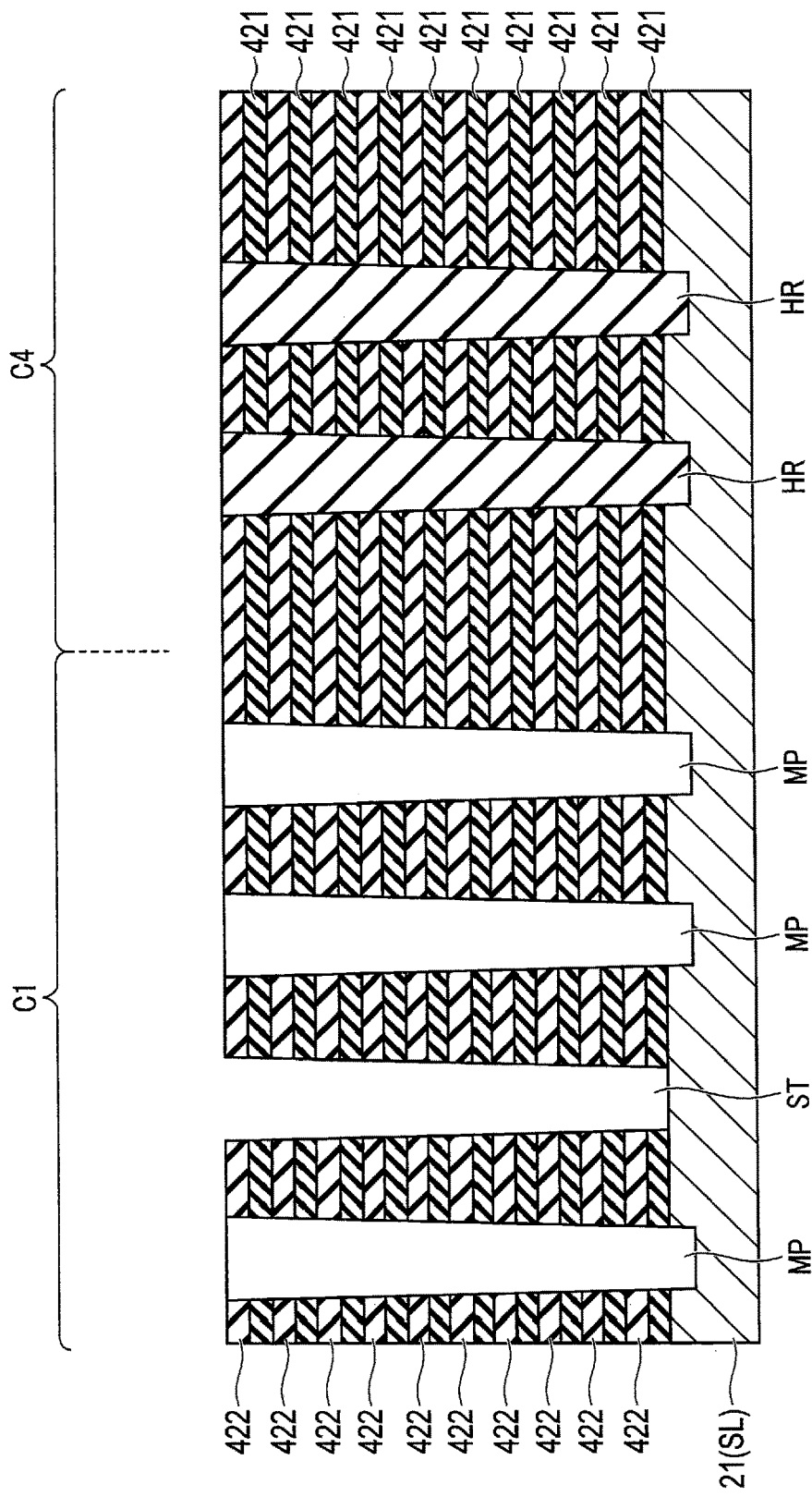
FIG. 20 is a cross-sectional view of the memory cell array 10 for illustrating a step of manufacturing the semiconductor memory device 1 according to the comparative example.

Subsequently, as shown in FIG. 20, the slit ST is formed.

[Step S2004]

Next, as shown in FIG. 21, wet etching using, e.g., hot phosphoric acid is performed via the slit ST. In this manner, the sacrificial members 422 are selectively removed. The structure from which the sacrificial members 422 have been removed maintains its three-dimensional structure owing to, for example, a plurality of memory pillars MP, a plurality of support pillars HR, etc.

[Step S2005]

Figure 22:
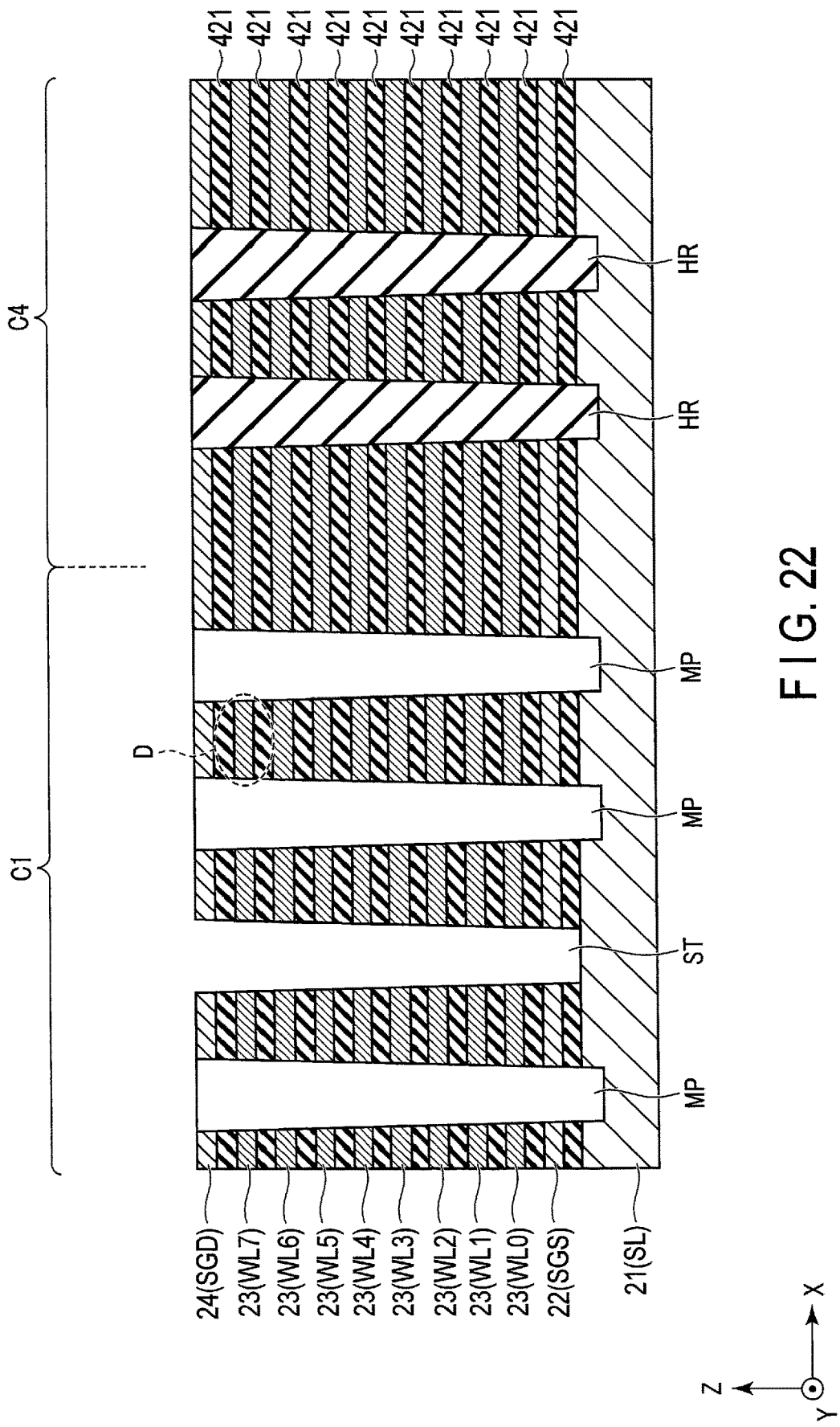
FIG. 22 is a cross-sectional view of the memory cell array 10 for illustrating a step of manufacturing the semiconductor memory device 1 according to the comparative example.

Next, replacement processing for the word line portions and the select gate line portions is performed. Specifically, as shown in FIGS. 22 and 23, in a space from which the sacrificial members 422 have been removed, tungsten (W) 424 is formed by, for example, CVD after titanium nitride (TiN) 423 is formed as a barrier metal. In this manner, the plurality of conductive layers 23 respectively corresponding to the word lines WL0 to WL7, and the conductive layers 24 respectively corresponding to the select gate lines SGD are formed.

The tungsten (W) 424 is formed using tungsten hexafluoride ($WF_6$) gas. However, fluorine (F) contained in tungsten hexafluoride ($WF_6$) gas may exert a negative influence on the memory pillars MP. Therefore, unlike the embodiment, the comparative example requires titanium nitride (TiN) 423 to be formed as a barrier metal.

This titanium nitride (TiN) has a film thickness of d1 (for example, about 3 nm).

Thereafter, the semiconductor memory device is formed through a discretionary manufacturing step.

As described in the above, in the comparative example, the semiconductor memory device is formed by alternatively stacking silicon oxide ($SiO_2$) and silicon nitride (SiN) to form a plurality of layers as the stacked structure, removing the silicon nitride (SiN) at the time of forming the slit, and embedding the barrier metal and the conductive material as members for the select gate lines and the word lines.

However, as described in the comparative example, in the case of removing the sacrificial members 422, the support portions HR are required to maintain the three-dimensional structure. Furthermore, as compared to the embodiment, more slits ST are required in order to completely spread an etching solution for removing the sacrificial members 422. In the comparative example, after the memory pillar is formed, the tungsten (W) is formed as the select gate lines and the word lines. This requires the barrier metal for protecting the memory pillars MP from fluorine (F) in tungsten hexafluoride ($WF_6$) gas at the time of formation of the tungsten (W).

On the other hand, the embodiment described in the above does not involve removal of the sacrificial members such as that in step S2004 of the comparative example. This eliminates the necessity of the support portions HR for supporting the three-dimensional structure. As a result, the embodiment achieves reduction in area by the amount of the support portions HR as compared to the comparative example. In other words, in the step area according to the embodiment, all of the pillar-shaped bodies extending in the Z direction may be deemed to be contact plugs. The dummy step areas are not provided with a pillar-shaped body extending in the Z direction. According to the embodiment described in the above, there is no need to spread an etching solution for removing the sacrificial members 422. As a result, the present embodiment achieves reduction in number of the slits ST and reduction in area by the amount of the slits. According to the embodiment described in the above, unlike the comparative example, the memory pillars MP are formed after the select gate lines and the word lines are formed. The memory pillars MP are not subjected to tungsten hexafluoride ($WF_6$) gas. This eliminates the need to form the barrier metal in the select gate lines and the word lines such as that described in the comparative example. Specifically, the barrier metal is not provided between each select gate line and its adjacent insulating film, between each word line and its adjacent insulating film, between each memory pillar and a word line, and between each memory pillar and a select gate line. As a result, in the present embodiment, each of the select gate lines and word lines can be reduced in area by d1×2 (6 nm in the case of the barrier metal having a thickness of 3 nm) in each of the Z axis, the X axis, and the Y axis. The insulating film reduced in its film thickness realizes reduction in resistance of word lines. As described in the above, according to the embodiment described in the above, the semiconductor memory device can be reduced in size as compared to the comparative example.

<2> Other Modifications, Etc.

The manufacturing steps described in the above embodiment and modification are mere examples. Another step may be interposed between manufacturing steps, and the order of the manufacturing steps may be altered as appropriate. Any manufacturing steps of the semiconductor memory device 1 may be adopted as long as the configurations described in the embodiment and modifications can be formed.

In the above embodiment, the memory cell array 10 may have a different structure. For example, the memory pillar MP may have a structure in which a plurality of pillars are coupled in the Z direction. Alternatively, the memory pillar MP may have a structure in which a pillar penetrating the conductive layer 24 (select gate line SGD) is coupled to a pillar penetrating the plurality of conductive layers 23 (word lines WL). Alternatively, the memory pillar MP may have a structure in which a plurality of pillars each penetrating the plurality of conductive layers 23 are coupled in the Z direction.

Throughout this description, "polysilicon" can be reworded as a polycrystalline semiconductor.

While several embodiments have been described, these embodiments have been presented by way of example and are not intended to limit the scope of the invention. This novel embodiment may be embodied in various forms, and various omissions, replacements, and changes can be made thereon without departing from the spirit of the invention. The embodiment and modifications are included in the scope and spirit of the invention and are included in the scope of the claimed inventions and their equivalents.

What is claimed is:

1. A semiconductor memory device comprising:
   a first stacked body including a plurality of first conductive layers and a plurality of insulating films alternatively stacked in a first direction, the plurality of first conductive layers each including tungsten;
   a second stacked body provided adjacent to the first stacked body in a second direction and including a plurality of second conductive layers and the plurality of insulating films alternatively stacked in the first direction, the plurality of second conductive layers being respectively disposed in a same level in the first direction as a corresponding layer of the plurality of first conductive layers, the plurality of second conductive layers including a silicon containing an impurity, the second direction crossing the first direction;
   a semiconductor layer extending in the first direction through an inside of the first stacked body;
   a charge storage layer arranged between the plurality of first conductive layers and the semiconductor layer in the first stacked body;
   a plurality of contact plugs respectively provided on a corresponding layer of the plurality of second conductive layers; and
   the plurality of first conductive layers, which include the tungsten, are in direct contact on a same plane with the plurality of second conductive layers, which include the silicon containing the impurity, respectively.

2. The semiconductor memory device according to claim 1, wherein pillar-shaped bodies that are each provided on the corresponding layer of the plurality of second conductive layers in such a manner as to be in contact with the corresponding layer and extend in the first direction are all the plurality of contact plugs.

3. The semiconductor memory device according to claim 1, wherein the plurality of second conductive layers include polysilicon containing an impurity.

4. The semiconductor memory device according to claim 1, further comprising a third stacked body provided adjacent to the first stacked body in a third direction and including a plurality of third conductive layers and the plurality of insulating films alternatively stacked in the first direction, the plurality of third conductive layers being respectively disposed in a same level in the first direction as a corresponding layer of the plurality of first conductive layers, the plurality of third conductive layers including silicon containing an impurity, the third direction crossing the first direction and the second direction.

5. The semiconductor memory device according to claim 4, wherein a pillar-shaped body that is provided on a single third conductive layer of the plurality of third conductive layers in such a manner as to be in contact with the single third conductive layer is not provided on the third stacked body.

6. The semiconductor memory device according to claim 4, wherein the plurality of third conductive layers include polysilicon containing an impurity.

7. The semiconductor memory device according to claim 1, wherein no barrier metal is arranged between the plurality of first conductive layers and the plurality of insulating films and between the semiconductor layer and the plurality of insulating films.

8. The semiconductor memory device according to claim 7, wherein the barrier metal includes titanium nitride.

* * * * *